United States Patent [19]
Ajit

[11] Patent Number: 5,719,411
[45] Date of Patent: Feb. 17, 1998

[54] THREE-TERMINAL MOS-GATE CONTROLLED THYRISTOR STRUCTURES WITH CURRENT SATURATION CHARACTERISTICS

[75] Inventor: Janardhanan S. Ajit, Redondo Beach, Calif.

[73] Assignee: International Rectifier Corporation, El Segundo, Calif.

[21] Appl. No.: 516,824

[22] Filed: Aug. 18, 1995

Related U.S. Application Data

[63] Continuation-in-part of Ser. No. 281,917, Jul. 28, 1994, Pat. No. 5,444,272.

[51] Int. Cl.$^6$ .................... H01L 29/74; H01L 31/111
[52] U.S. Cl. .................... 257/132; 257/133; 257/137; 257/138; 257/146; 257/154; 257/163
[58] Field of Search .................... 257/132, 133, 257/137, 138, 146, 154, 163

[56] References Cited

U.S. PATENT DOCUMENTS

| | | | |
|---|---|---|---|
| 5,105,244 | 4/1992 | Bauer. | |
| 5,198,687 | 3/1993 | Baliga | 257/137 |
| 5,286,981 | 2/1994 | Lilja et al. | 257/132 |
| 5,336,907 | 8/1994 | Nakanishi et al. | 257/133 |

FOREIGN PATENT DOCUMENTS

| | | |
|---|---|---|
| 0075720 | 8/1982 | European Pat. Off.. |
| 0540017 | 10/1992 | European Pat. Off.. |
| 2267996 | 12/1993 | United Kingdom. |
| WO9322798 | 11/1993 | WIPO. |

OTHER PUBLICATIONS

M.S. Shekar et al., "High-Voltage Current Saturation in Emitter Switched Thyristors", IEEE EDL, pp. 387-389 (Jul. 1991).

M. Nandakumar et al., "Fast Switching Power MOS-Gated (EST and BRT) Thyristors", Proceedings of International Symposium on Power Semiconductor Devices, May 1992.

B. Jackson et al., "Effects of Emitter-Open Switching on the Turn-Off Characteristics of High-Voltage Power Transistors", Power Electronics Specialist Conference, pp. 147-154, Jun. 1980.

V.A.K. Temple, "MOS Controlled Thyristors (MCT's)", IEDM Technical Digest, pp. 282-285 (Dec. 1984).

Primary Examiner—Ngân V. Ngô
Attorney, Agent, or Firm—Ostrolenk, Faber, Gerb & Soffen, LLP

[57] ABSTRACT

MOS-gate controlled thyristor structures which have current saturation characteristics, do not have any parasitic thyristor structure, and require only a single gate drive. A resistive structure such as a MOSFET, Schottky diode, PN junction diode, diffused resistor or punch-through device (e.g. punch through PNP structure) is incorporated in series with the $N^+$ emitter of the thyristor. In the on-state of the device, with a positive gate voltage, when operating at high currents, because of the voltage drop in the resistive structure in series with the $N^+$ emitter, the potential of the $N^+$ emitter, and along with it the potential of the P base, increases. When the potential is increased beyond a certain predetermined value, diversion of current is accomplished by one of the following ways: (i) the smallest distance between the P base region and the $P^+$ cathode is such that punch-through occurs in these regions. Occurrence of punch-through creates paths to divert the hole current at areas where punch-through occurs; (ii) the threshold voltage and channel conductance of a PMOS is such that sufficient hole current diversion occurs. The doping of the P base region is such that formation of these punch-through or PMOS channel paths causes the resistance of the P base regions to ground to become sufficiently low so as to cause the thyristor current to become less than its holding current. This causes the thyristor to become unlatched. But the transistor paths (PNP and IGBT current paths) in the device still conduct current because the gate voltage of the turn-on DMOSFET is greater that its threshold voltage. Current in the device ultimately saturates similar to an IGBT.

43 Claims, 25 Drawing Sheets

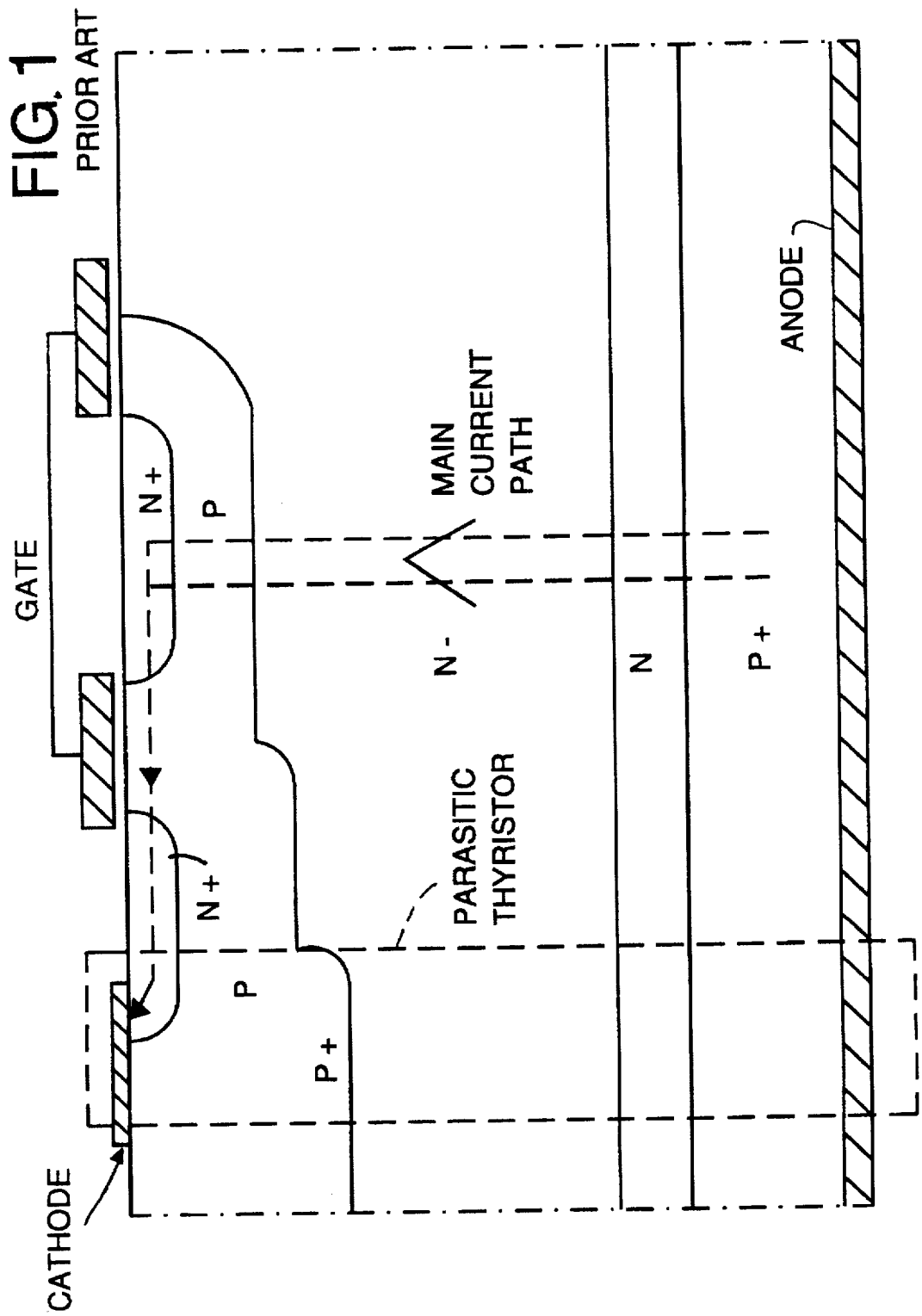

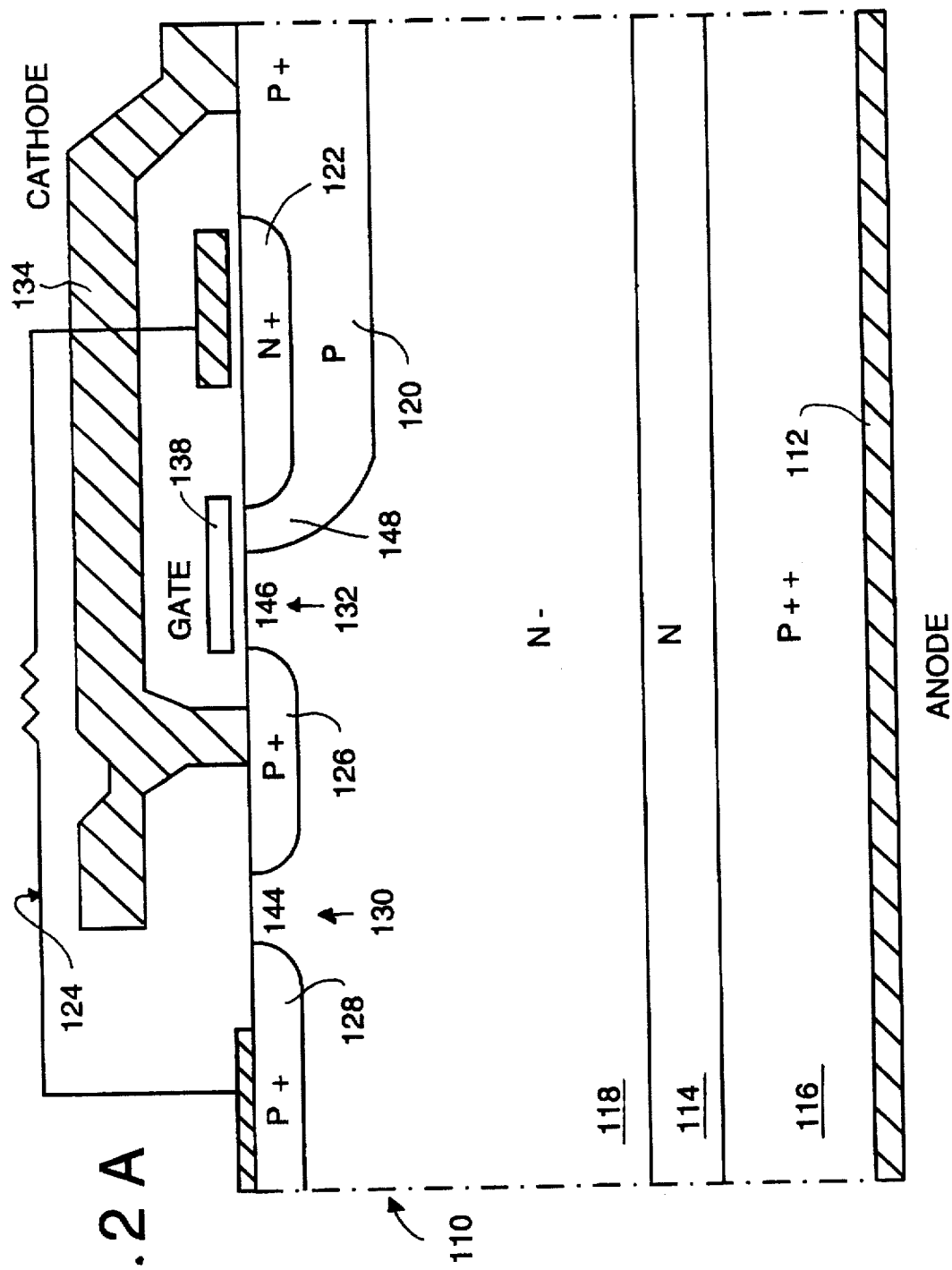

THREE-TERMINAL MOS-GATE CONTROLLED THYRISTOR STRUCTURES WITH CURRENT SATURATION CHARACTERISTICS

This is a continuation-in-part of application Ser. No. 08/281,917, filed Jul. 28, 1994, now U.S. Pat. No. 5,444, 272, the disclosure of which is herein incorporated by reference.

BACKGROUND OF THE INVENTION

1. Field of Invention

The present invention relates to a MOS-controlled thyristor and more particularly, to a MOS-controlled thyristor with current saturation characteristics obtained by a negative feedback mechanism.

2. Description of the Related Art

Power semiconductor structures that combine bipolar conducting mechanisms with a MOS control are well known. The insulated gate bipolar transistor (IGBT) is an example of such a device, in which the base current of a bipolar structure is controlled via an integrated MOSFET. The IGBT is best suited for high-voltage power electronic applications with blocking voltages in the range of 600 volts. IGBTs capable of handling higher voltages have a higher on-state voltage drop, which is disadvantageous. Since a lower on-state voltage drop is achievable by carrying the on-state current through a thyristor structure, MOS-gated thyristors have received considerable interest for high current, high voltage applications.

Two types of previously reported MOS-gated thyristors are: (1) the MOS-controlled thyristor (MCT)/base resistance controlled thyristor (BRT), and (2) the emitter-switched thyristor (EST). In the MCT and BRT, as described in an article by V. A. K. Temple, *IEEE International Electron Device Meeting (IEDM) Technical Digest*, San Francisco (December, 1984), pp. 282–85, a cathode short circuit is switched via a MOS gate. However, the MCT and BRT do not have any current limiting capability and hence no short-circuit capability. Also, although the maximum controllable current of single cell MCT and BRT devices is large, a significant reduction is observed in multi-cellular devices due to variation of turn-off channel resistance leading to current filamentation.

The EST, as shown in FIG. 1 and FIG. 1A, basically consists of a MOSFET in series with a thyristor, and is said to be "emitter-switched." Higher controllable currents and better Safe Operating Area (SOA) are obtained by leaving the $N^+$ emitter floating during on-state and turn-off in the EST, because it reduces the dependence of maximum turn-off current capability on the variation of channel resistance across the multicellular die. However, in the EST structure shown in FIG. 1A designed to withstand reasonable voltages when conducting current in the on-state, the lateral channel length composed of two double-diffused DMOS structures has to be sufficiently long, approximately 7 μm for a 600 V device. See M. S. Shekar et al., "High Voltage Current Saturation in Emitter-Switched Thyristors", IEEE EDL, pp. 387–389 (July, 1991). This results in an increased on-state drop for the EST and the best reported on-state drop of an EST is only 6% lower than that of the IGBT.

Also, while the EST exhibits current saturation characteristics, it is, however, limited by an inherent parasitic thyristor, shown in FIG. 1 and FIG. 1A, which bypasses the gate-controlled n-channel MOSFET and limits the maximum controllable current. Accordingly, a need exists for a MOS-gate controlled thyristor which has current saturation characteristics, uniform turn-off capability, a low on-state voltage drop and is not limited by a parasitic thyristor structure within the device.

SUMMARY OF THE INVENTION

The present invention overcomes the disadvantages of the prior devices and achieves the foregoing objective by providing MOS-gate controlled thyristor structures which have current saturation characteristics, uniform turn-off capability, do not have any parasitic thyristor structure, have a low on-state voltage drop and require only a single gate drive.

More specifically, the structures of the present invention, in each of the various embodiments, comprise a wafer of semiconductor material having first and second spaced, parallel planar surfaces. A relatively lightly doped N-type layer extends from the first semiconductor surface, while a P-type layer extends from the second semiconductor surface.

A P-type base is formed in the relatively lightly doped N-type layer and extends from the first semiconductor surface to a first depth beneath the first semiconductor surface. An $N^+$ emitter region formed in the P-type base extends from the first semiconductor surface to a second depth beneath the semiconductor surface which is shallower than the first depth to create an $N^+$ emitter/P-type base junction, the $N^+$ emitter region being radially inwardly spaced along the first semiconductor surface along portion of edges of the P-type base, such that the edges of the P-type base extend to the first semiconductor surface, thereby defining a first channel region along a portion of the edges.

A $P^+$ cathode region is formed in the relatively lightly doped N-type layer and extends from the first semiconductor surface, the $P^+$ region being laterally spaced from a portion of edge of the P-type base to form a second channel region in the relatively lightly doped N-type layer.

The structures of the present invention include an insulated gate disposed over the first and second channel regions, an anode electrode is connected to the P-type layer disposed on the second semiconductor surface, a cathode electrode is connected to the $P^+$ cathode and a gate electrode connected to the insulated gate.

Advantageously, each of the structures of the present invention include a resistive structure disposed in series with the $N^+$ emitter. The resistive structure can be a MOSFET, a diffused $N^+$ resistance and/or an $N^+$ contact resistance, a polysilicon resistive structure, a punch-through device (e.g., a punch-through PNP or NPN structure), a PN diode, or a Schottky diode.

In the on-state of the device, with a positive gate voltage, when operating at high currents, because of the voltage drop in the resistive structure in series with $N^+$ the emitter, the potential of the $N^+$ emitter, and along with it the potential of the P base, increases. When the potential is increased beyond a certain predetermined value, current diversion is accomplished by one of the following ways: (i) the smallest distance between the P base region and the $P^+$ cathode is such that punch-through occurs in these regions. Occurrence of punch-through creates paths to divert the hole current at areas where punch-through occurs; (ii) the threshold voltage and channel conductance of a PMOS is such that sufficient hole diversion occurs.

The doping of the P base region is such that formation of these punch-through or PMOS channel paths causes the resistance of the P base regions to ground to become sufficiently low so as to cause the thyristor current to become less than its holding current. This causes the thyristor to become unlatched. But the transistor paths (PNP and IGBT current paths) in the device still conduct current because the gate voltage of the turn-on DMOSFET of said first channel region is greater that its threshold voltage. Current in the device ultimately saturates similar to an IGBT.

The device is preferably provided in a cellular topology. A P-diffusion can optionally be provided under the insulated gate between the P-type base and the $P^+$ cathode in certain areas of the cellular device to connect the P-type base to ground through a MOS gate controlled resistance path. This enables a smaller $N^+$ emitter length for the same latching density and thus leads to higher channel density for the structure.

The device of the present invention can be provided in an emitter-switched configuration.

Advantageously, as described in further detail below, the structures of the present invention have current saturation characteristics without any parasitic thyristor structure. Superior turn-off and a wider Safe-Operating-Area are achieved by the structures of the present invention because the emitter/base junction is reverse-biased towards the end of the turn-off process. Furthermore, the junction patterns are easily fabricated.

Other features and advantages of the present invention will become apparent from the following description of the invention which refers to the accompanying drawings.

BRIEF DESCRIPTION OF THE DRAWINGS

FIG. 1 is a cross-sectional view of a typical prior art Emitter Switched Thyristor (EST).

FIG. 2A is a cross-sectional view of a variation of the first embodiment of the invention in which a PNP punch-through structure is in series with the $N^+$ emitter.

FIG. 18A shows an equivalent circuit of the embodiment of FIG. 18.

FIG. 19A shows an equivalent circuit of the embodiment of FIG. 19.

DETAILED DESCRIPTION OF THE PREFERRED EMBODIMENTS

The present invention can be implemented in a plurality of different thyristor structures, each of which have current saturation characteristics obtained by the same basic mechanism, namely by introducing a resistive structure in series with the $N^+$ emitter to increase the potential of the $N^+$ emitter when the current is increased.

Figure 1A:
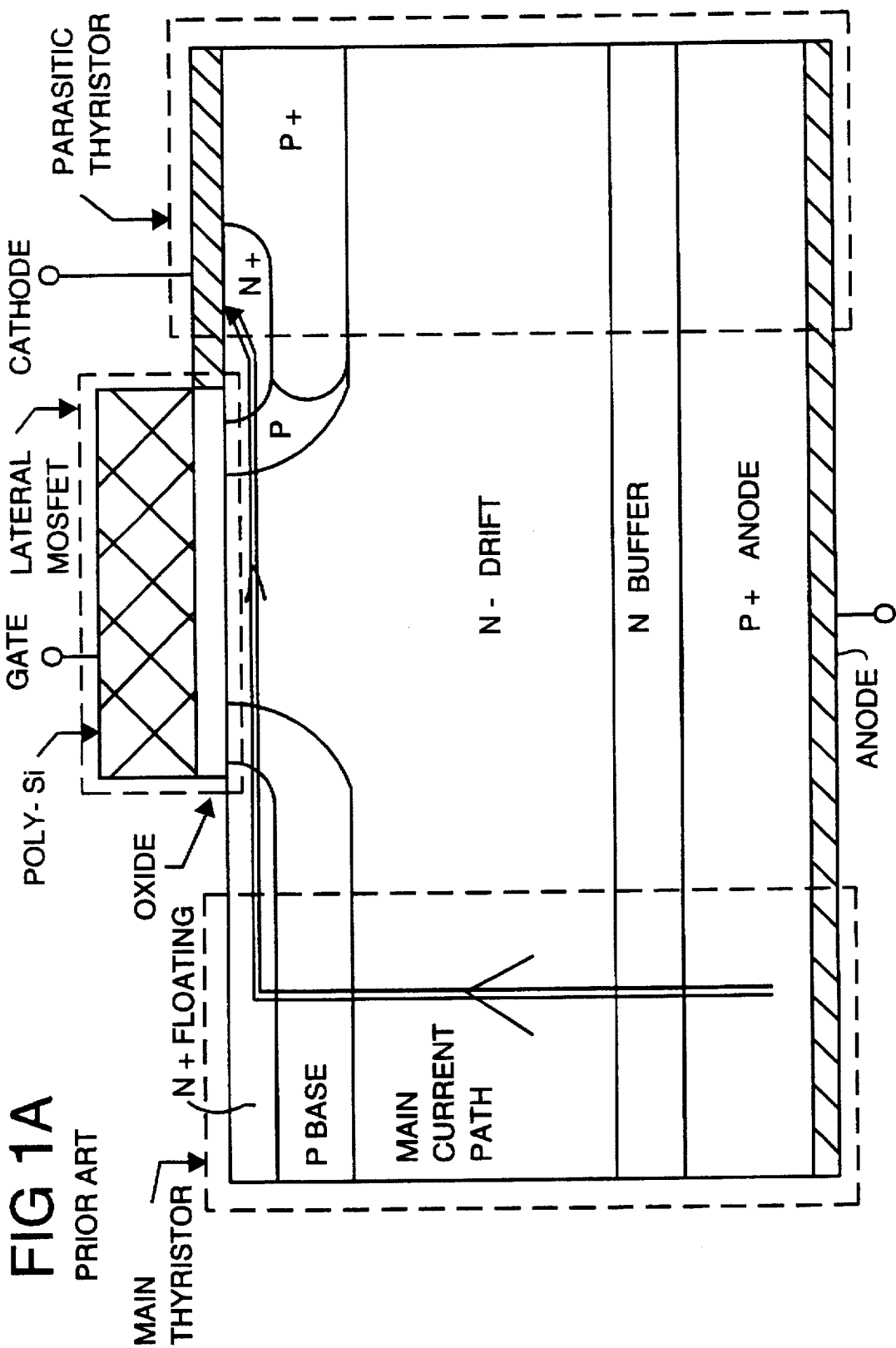
FIG. 1A is a cross-sectional view of a prior art EST designed for High Voltage Current Saturation.
Figure 2:
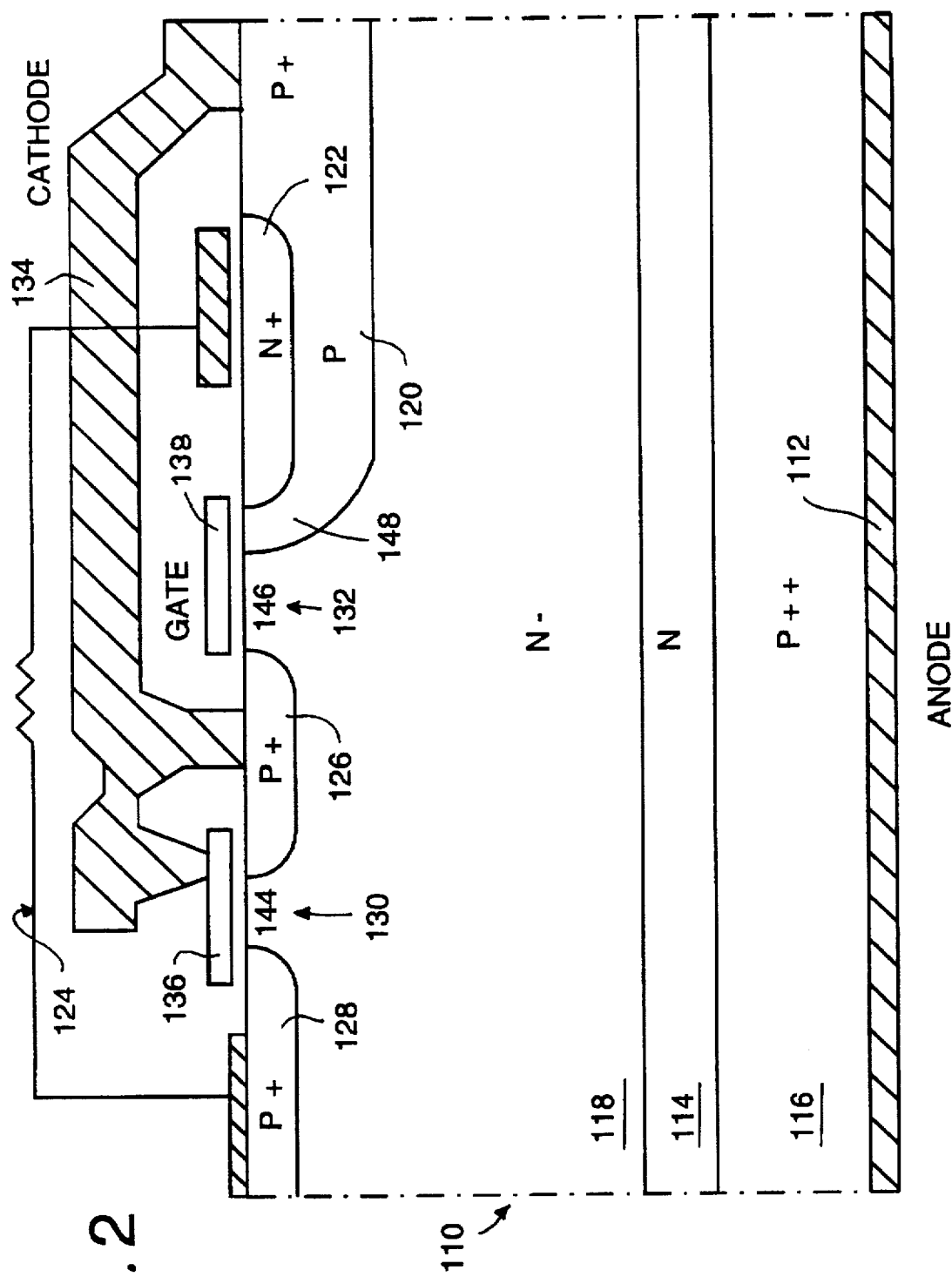
FIG. 2 is a cross-sectional view of a half-a-unit cell of the first embodiment of the present invention.

A cross-sectional view of half-a-unit cell of a first embodiment of the MOS-controlled thyristor of the present invention is shown in FIG. 2. MOS-controlled thyristor 110 is a vertical conduction device.

Each half-cell of the device of the present invention structure consists of a lateral p-channel MOSFET in series with a high-voltage vertical $P^{++}NN^-PN^{++}$ thyristor structure. The N-type layer 114 and a very highly doped $P^{++}$ emitter region 116 are disposed on the underside of an $N^-$ layer 118. For lower voltage applications (<1200 V), $N^-$ layer 118 is preferably epitaxially grown on a N epi/$P^{++}$ substrate. For higher voltage applications (>1200 V), $N^-$ layer 118 is preferably the starting substrate material and N layer 114 and $P^{++}$ region 116 are backside diffusions.

An anode electrode 112 on the bottom surface of the device covers $P^+$ region 116. Anode electrode 112 is coupled to an anode terminal.

The layer thicknesses and concentrations depend on the device blocking voltage. For a 2,500 V device, the doping density and thickness of $N^-$ drift region are in the range of $2 \times 10^{13}$ cm$^{-3}$ and 500 µm, respectively. The doping density of $P^{++}$ region 116 is preferably greater than $5 \times 10^{19}$ cm$^{-3}$, with a thickness greater than 1 µm. The doping density of N layer 114 is preferably approximately $5 \times 10^{17}$ cm$^{-3}$, with a thickness of approximately 7 µm.

Disposed within $N^-$ layer 118 is a P-type base 120. An $N^+$ emitter region 122 is disposed within P base 120. Two additional P-type regions extend into the chip from the upper surface of the device, namely $P^+$ cathode region 126 and $P^+$ region 128. $P^+$ cathode region 126 and $P^+$ region 128 are separated from each other by a relatively small region of $N^-$ layer 118 which extends to the surface of the wafer to form a first channel region 130, which serves as the channel of a lateral turn-on PMOS 144. Similarly, P base region 120 is separated from P⁺ cathode region 126 by a relatively small region of N⁻ layer 118 which extends to the surface of the wafer to form a second channel region 132, which serves as the channel of a turn-off PMOS 146.

N⁺ emitter region 122 of the thyristor is shorted to the source 128 of turn-on PMOS 144 by a floating metal strap 124. A cathode electrode 134 contacts the drain of PMOS 144 and also the gate 136 of PMOS 144. This end of the N⁺ emitter/P base junction incorporates a DMOS structure which forms an n-channel DMOSFET 148 to turn-on the thyristor. The other end of the P base 120 is contacted by cathode metal 134. A gate electrode 138 overlies n-channel DMOSFET 148 and the turn-off p-channel MOSFET 146. Gates 136 and 138 are preferably comprised of polysilicon and are insulated from the upper surface of the device by a layer of oxide (not shown in FIG. 2).

Figure 3:
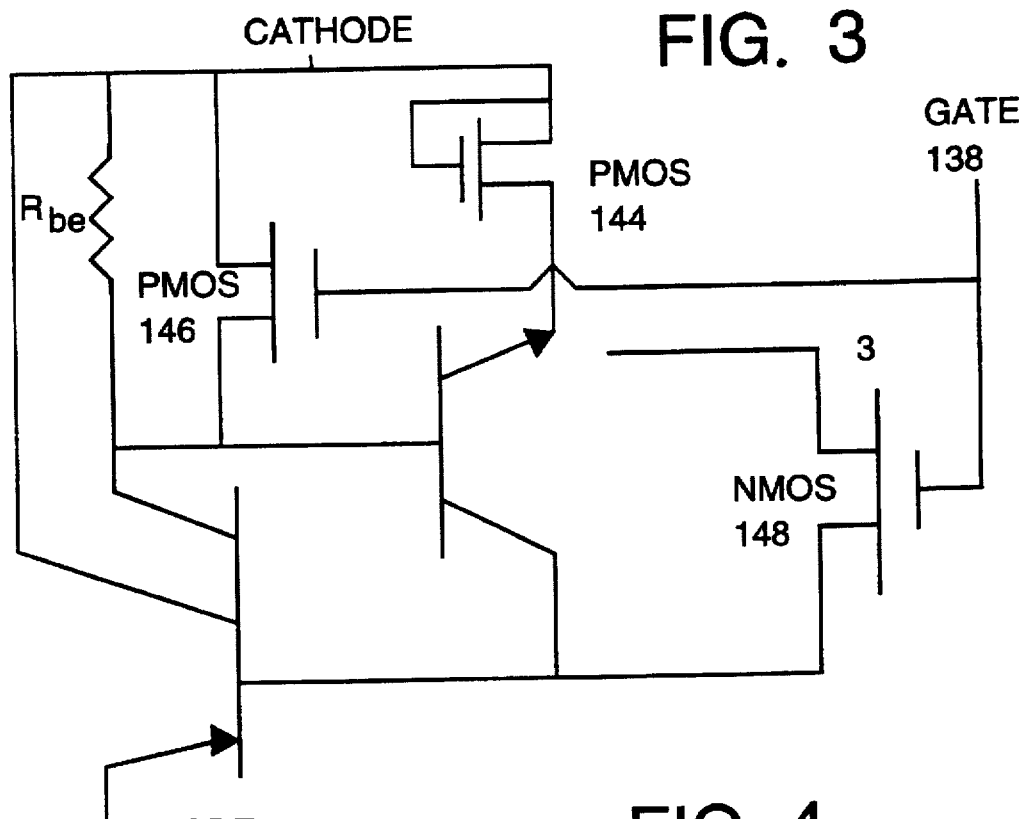
FIG. 3 is an equivalent circuit of the first embodiment of the present invention.

The equivalent circuit of the device of the present invention is shown in FIG. 3. In the on-state, with the anode at a positive potential with respect to the cathode and the voltage on gate electrode 138 sufficiently positive to turn-on the n-channel DMOSFET 148, when the anode voltage is increased, the potential of P base 120 (source of the turn-on p-channel MOSFET 144) increases activating the turn-on p-channel MOSFET 144. In this situation, the N⁺ emitter 122 is connected to ground potential through the floating metal strap 124 and lateral turn-on PMOS 144 and the base drive for the vertical PNP transistor is provided through the n-channel MOSFET 148 under gate electrode 138.

When the P⁺⁺ emitter/N⁻ epi junction is forward biased by about 0.7 volts, the P⁺⁺ emitter 116 starts injecting holes which supplies the base drive for the NPN transistor causing the thyristor to go into the latched state. Current now flows through the thyristor in series with the lateral PMOS. The lateral PMOS 144 operates in the current-saturation regime because its gate is shorted to its drain.

Device simulations indicate that the voltage drop across the lateral PMOS 144 is approximately 1.2 V at a current density of 200 A/cm². For a p-channel device consisting of a series lateral NMOS in structure, the voltage drop increase over the thyristor drop is approximately 0.5 V. This would translate to a reduction of 50% in on-state voltage drop for the p-channel over IGBT at a current density of 200 A/cm² for 600 V devices.

The minimum length of the polysilicon gates is preferably designed such that the P base 120 punches-through to ground potential of the P⁺ cathode 126 at a lower potential compared to the potential at which the N⁺ emitter 122 through the floating P⁺ region 128 punches-through to ground potential of the P⁺ cathode 126. This prevents the device from showing snap-back behavior in current-voltage characteristics in the on-state.

At high currents, the increase in voltage drop across the thyristor section is almost negligible and the lateral PMOS 144 limits the current with the voltage drop (V) across the lateral PMOS 144 increasing with the current (I) [$V_{MOSFET} \alpha (I)^n$, where n varies from 0.5 to 1]. It is possible to obtain current saturation capability in the device of the present invention at a predetermined high current as described as follows with respect to an n-channel device.

When operating at high currents, because of the voltage drop in lateral PMOS 144, the potential of the N⁺ emitter 122 and, along with it, the potential of the P base region 120 increases. When the potential is increased beyond a certain value, the smallest distance between the P base region 120 and the P⁺ cathode 126 is such that punch-through occurs. This creates an additional path for holes to flow from P base region 120, reducing the resistance of the P base region 120. The reduction of resistance of the P base region 120 leads to decrease in the thyristor current. But as soon as the thyristor current decreases, the voltage drop of the lateral PMOS 144 decreases and consequently a reduction of potential of the N⁺ emitter 122 and the P base 120. This takes the P base 120 out of the punch-through situation causing increase in the effective P base resistance in a negative feedback mechanism. This negative feedback mechanism leads to current saturation in the device.

The thyristor can be turned-off by reducing the gate electrode voltage from positive to negative to activate the lateral PMOS 146 from the P base 120 to the P⁺ cathode 126 and causing the N⁺ emitter 122 to be open-circuited. The negative feedback mechanism described earlier reduces the risk of current crowding.

Figure 4:
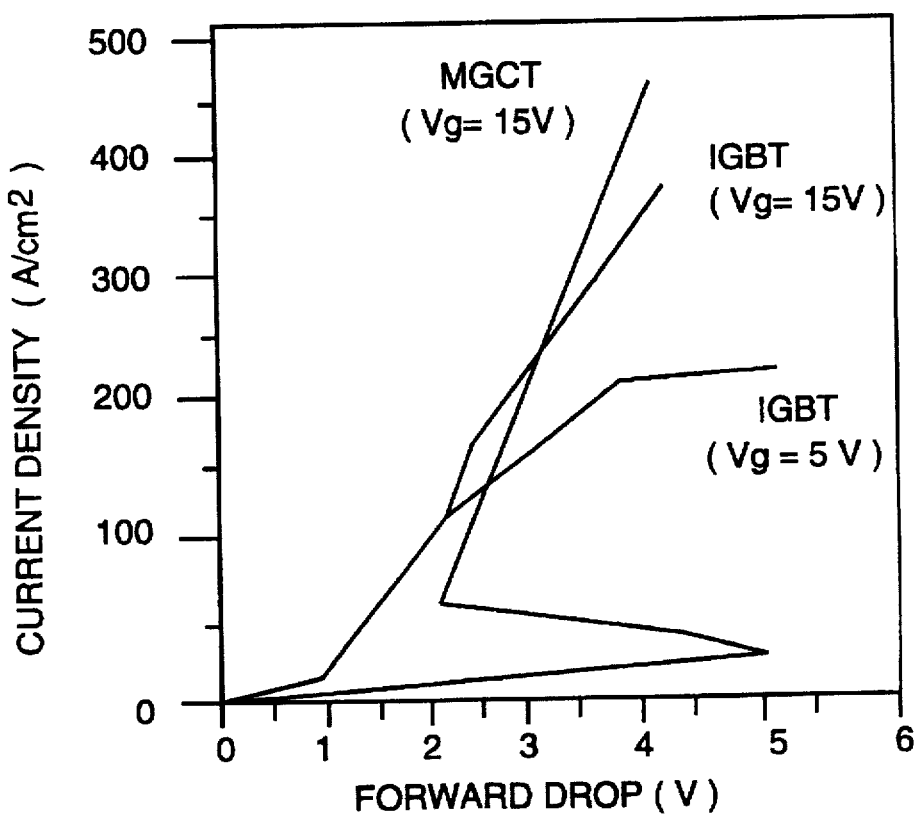
FIG. 4 shows the simulated I–V characteristics of the first embodiment of the present invention.

Two-dimensional device simulations of the n-channel device of the present invention were performed. Unlike the IGBT and EST, the device of the present invention does not have any parasitic thyristor structure. The simulated I–V characteristics of the device of the present invention is shown in FIG. 4. The n-channel device of the present invention shows about 20% improvement over the IGBT in on-state voltage drop at a current density of 200 A/cm² for 600 V devices. The simulations demonstrate that current saturation is obtained in the device of the present invention. The current at which saturation occurs can be controlled by the gate length, the P base doping, and junction depths of P base 120 and P⁺ cathode 126.

Unlike the IGBT in which only the bottom part of the drift region is conductivity modulated, the entire drift region is conductivity modulated in the device of the present invention. For the IGBT, the on-state drop increases with increase in device blocking voltage because of increase in the drift region thickness. For the device of the present invention, because of strong conductivity modulation of the entire drift region, the voltage drop in the drift region is almost independent of the drift region thickness. Hence, a great improvement in on-state characteristics is obtained for higher (>1200 V) voltage devices for the device of the present invention in comparison to the IGBT. However, the turn-off time of the device of the present invention is longer than that of the IGBT because the entire drift region is conductivity modulated and filled with carriers in the device of the present invention. If desired, the turn-off time of the device of the present invention can be reduced by electron-irradiation. In any event, even with a longer turn-off time, the device of the present invention may offer a better on-state voltage drop/turn-off time trade-off as compared to the IGBT, as is the case with other thyristor structures—see M. Nandakumar et al., "Fast Switching Power MOS-Gated (EST and BRT) Thyristors", Proceedings of the International Symposium on Power Semiconductor Devices (ISPSD), May, 1992.

It is also possible to operate the device of the present invention as a four-terminal device by having gate 136 over the turn-on PMOS 144 connected to a separate terminal from the cathode. In this case, gate 136 would operate with a signal complementary to that of DMOS and turn-off PMOS gate 138. This mode of operation of the device of the present invention has been experimentally verified. In this four-terminal operation, a reduced voltage drop across the p-channel MOSFET 144 is obtained when a large negative voltage is applied to gate 136 of the p-channel MOSFET. However, the layout of a four-terminal device is complicated and the cell area is increased resulting in lower channel density.

Figure 5:
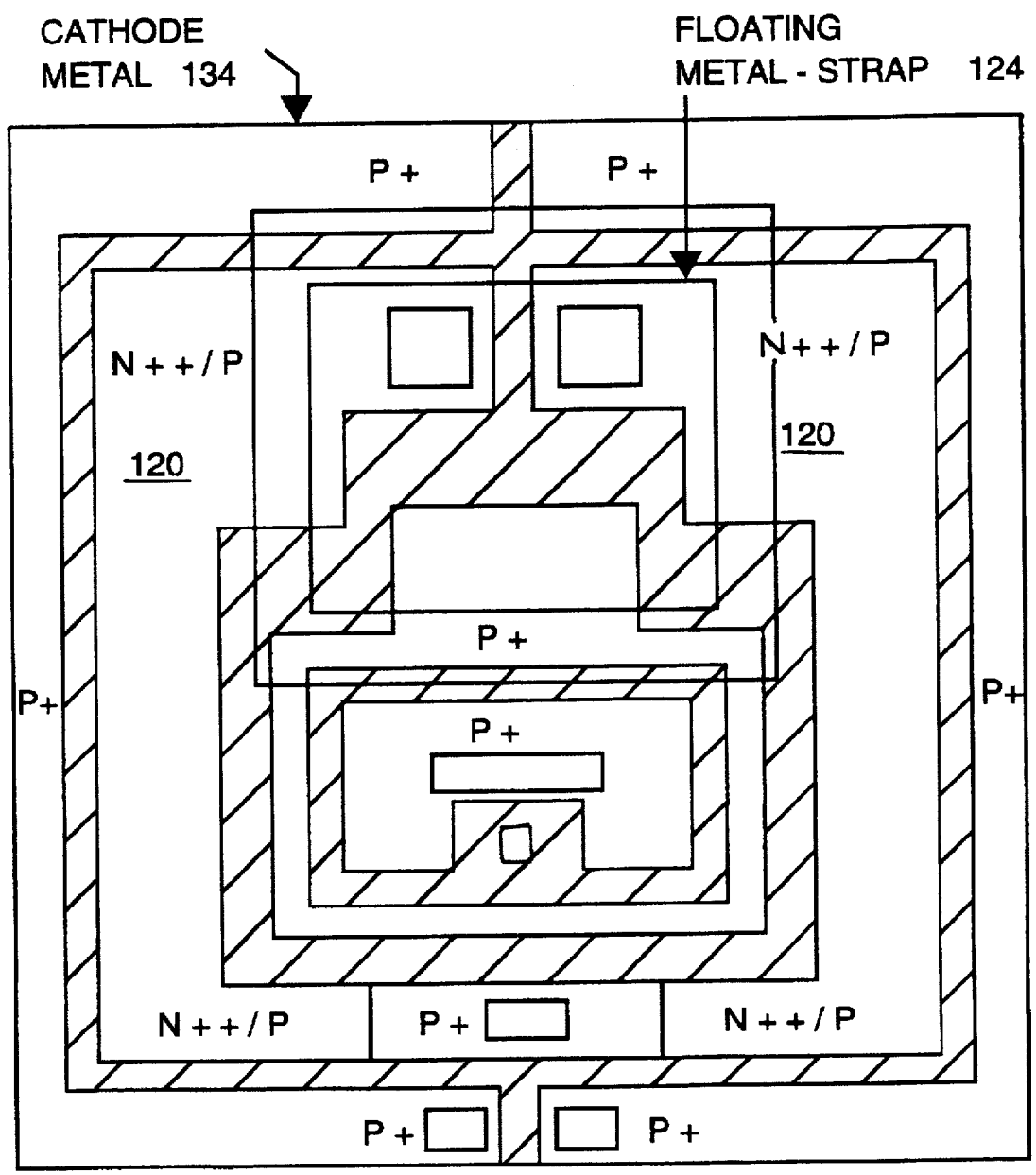
FIG. 5 shows the mask layout for the first embodiment of the present invention.

An efficient layout of the structure of the first embodiment of the invention requires double layer metallization. However, a single layer metallization as shown in the mask layout of FIG. 5 is also possible. The first step in the fabrication process is the definition of $P^+$ rings for termination. A second mask is used to define the active area of the device. This is followed by growth of gate oxide (500 A°) after which polysilicon is deposited and doped. The polysilicon is patterned using a fourth mask and the P base is formed by boron implantation of 5e13 cm$^{-2}$ at 50 KeV. This is followed by drive-in of the P base regions. Masks are used to define the $N^+$ emitter and $P^+$ implantations. This is followed by low temperature oxide (LTO) deposition and opening of the contact windows using a seventh mask. Metal (aluminum) is then deposited and patterned using an eighth mask. A passivating material is then deposited and patterned using a ninth mask. The last stage of the process consists of grinding part of the back-side substrate and deposition of the back metal.

It should be noted that, during the forward blocking condition, the $N^+$ emitter/P base junction of the present invention is reverse biased. Superior breakdown, turn-off characteristics and a wider Safe Operating Area are achieved by the present invention because this is similar to the case of the emitter-open turn off. In this regard, see, e.g., B. Jackson and D. Chen, "Effects of emitter-open switching on the turn-off characteristics of high voltage power transistors", *Power Electronics Specialist Conference*, June, 1980.

The on-state voltage drop of the high-voltage MOS-controlled thyristor of the present invention shown in FIG. 2 is the sum of the voltage drop across the high voltage thyristor (112-116-114-118-120-122) and the voltage drop across the low voltage p-channel MOSFET (120-146-126) under gate 138. The voltage drop across the high voltage thyristor does not increase much when the device is designed to support higher breakdown voltage. In contrast, in an IGBT, the on-state voltage drop increases when the IGBT is designed for higher breakdown voltages. This is because, in the IGBT, only the bottom part of the drift region is conductivity modulated, while in a thyristor the entire drift region is conductivity modulated. Hence, advantageously, the MOS-controlled thyristor of the present invention has a lower forward voltage drop than an IGBT for the same current for higher breakdown voltage (>1200 V) devices.

Additionally, advantageously, the present invention requires no short circuit protection because of its on-state current saturation characteristics, described previously. This is a major advantage compared to an MCT or BRT. Also, advantageously, the present invention does not have any parasitic thyristor structure to degrade performance. This is a major advantage compared to the prior-art EST.

Finally, the present invention advantageously has uniform turn-off capability as compared to an MCT or BRT.

The embodiment of the present invention described above and shown in FIG. 2 uses the lateral PMOS and/or a punch-through PNP in series with the $N^+$ emitter to reduce the base resistance and thereby obtain current saturation characteristics. FIG. 2A shows a variation of the first embodiment of FIG. 2 which consists of a punch-through PNP structure consisting of regions 128, 130 and 126 in series with the $N^+$ emitter 122. Another embodiment of the invention which uses the lateral PMOS and/or a punch-through PNP in series with the $N^+$ emitter to reduce the base resistance and thereby obtain current saturation characteristics is shown in FIG. 6.

Figure 6:
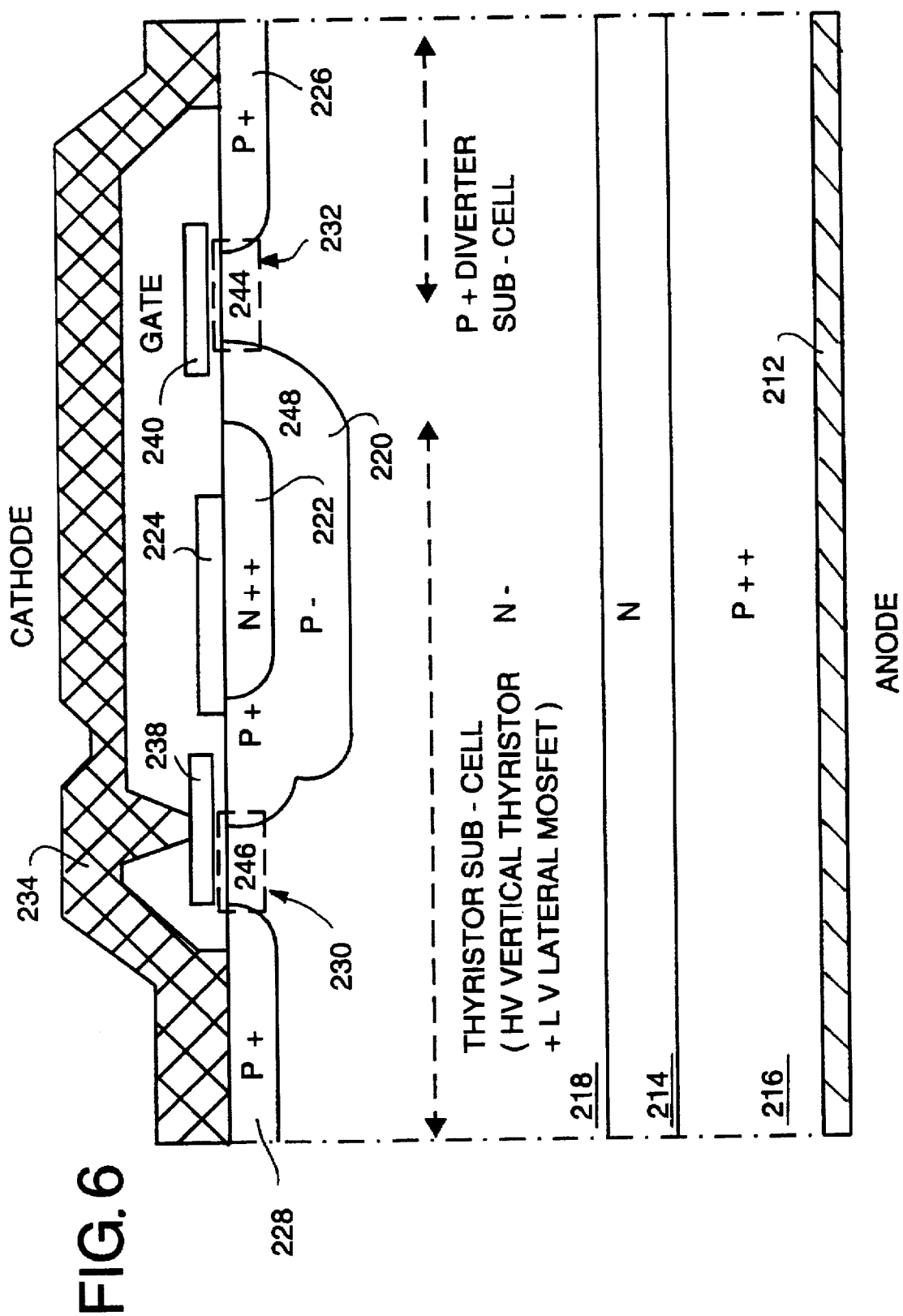
FIG. 6 is a cross-sectional view of a half-a-unit cell of the second embodiment of the invention.

As in FIG. 2, the MOS-controlled thyristor 210 of FIG. 6 is a vertical conduction device, preferably provided in a cellular topology, consisting of a lateral PMOS in series with a high-voltage vertical $P^{++}NN^-PN^{++}$ thyristor structure. Thus, the structure of FIG. 6 similarly includes an N layer 214 and a very highly doped $P^{++}$ region 216 disposed on the underside of an $N^-$ layer 218. An anode 212 on the bottom surface of the device covers $P^{++}$ region 216. The layer thicknesses and concentrations depend on the device blocking voltage and are the same as the device of FIG. 2.

As in the FIG. 2 embodiment, a P-type base region 220 containing an $N^+$ emitter region 222 is disposed within $N^-$ layer 218. In contrast to the embodiment of FIG. 2, the $N^+$ emitter region 222 of FIG. 6 is electrically shorted to the P-type base at one end by a contact plug or floating metal strap 224 on the upper surface of the device. This end of the P base 220 forms the source of a turn-on PMOS 246 as described below.

P-base 220 is surrounded by two P-type regions which extend into the chip from the upper surface of the device, namely $P^+$ region 228 and $P^+$ cathode region 226, but is separated therefrom by relatively small regions of $N^-$ layer 218 which extend to the surface of the wafer to form respective PMOS channel regions 230, 232 of turn-on PMOS 246 and turn-off PMOS 244, respectively.

A first insulated gate 238 overlies turn-on channel 230. A second insulated gate 240 overlies channel region 232 and, in addition, overlies the portion of P base 220 between $N^+$ emitter region 222 and channel region 232 at the upper surface of the wafer. As in the first embodiment, gates 238, 240 are preferably comprised of polysilicon and are preferably insulated from the upper surface of the device by a layer of oxide (not shown). A cathode electrode 234 makes ohmic contact to P regions 226 and 228, and to first insulated gate 238.

Figure 7:
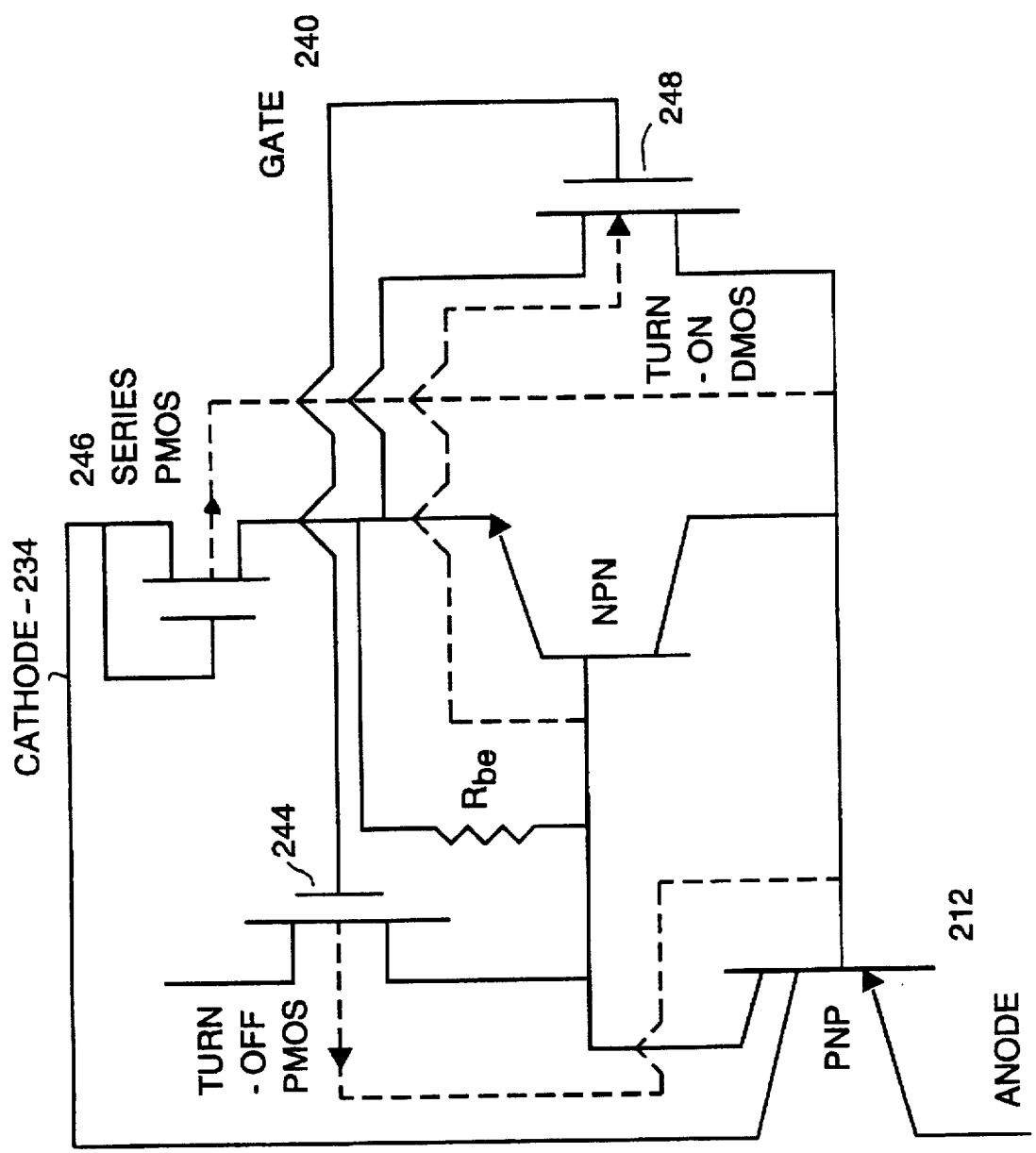
FIG. 7 is an equivalent circuit of the second embodiment of the invention.

The equivalent circuit of the FIG. 6 embodiment of the invention is shown in FIG. 7. The device of FIG. 6 operates similarly to the device of FIG. 2. Thus, in the on-state, with the anode at a positive potential with respect to the cathode and the voltage on gate electrode 238 sufficiently positive to turn-on the n-channel DMOSFET 248, when the anode voltage is increased, the potential of P base 220 (source of the turn-on p-channel MOSFET 244) increases activating the turn-on p-channel MOSFET 244. In this situation, the $N^+$ emitter 222 is connected to ground potential through the floating metal strap 224 and the lateral turn-on PMOS 246, and the base drive for the vertical PNP transistor is provided through the n-channel MOSFET 248 under gate electrode 238.

When the $P^{++}$ emitter/$N^-$ epi junction is forward biased by about 0.7 volts, the $P^{++}$ emitter 216 starts injecting holes, which supplies the base drive for the NPN transistor causing the thyristor to go into the latched state. Current now flows through the thyristor in series with the lateral PMOS 246. Lateral PMOS 246 operates in the current-saturation regime because its gate is shorted to its drain.

In similar fashion to the FIG. 2 embodiment, the minimum length of the polysilicon gates in FIG. 6 is preferably designed such that P base 220 near turn-off PMOS 244 punches-through to ground potential of the $P^+$ cathode 226 at a lower potential compared to the potential at which the $N^+$ emitter 222 at the side of the $N^+$ emitter short punches through to the potential of the cathode through P region 228. This prevents the device from showing snap-back behavior in current-voltage characteristics in the on-state.

To turn-off the device, a pulse of sufficiently negative potential is applied to gate 240 with respect to cathode 234 (to turn-off the n-channel MOSFET under gate 240 and turn-on the p-channel MOSFET under gate 240, thereby coupling P base 220 to P region 226, which is in turn electrically connected to the cathode.

As in the first embodiment, during the forward blocking condition, the $N^+$ emitter/P base junction in FIG. 6 is reverse biased. Thus, superior breakdown, turn-off characteristics and a wider Safe Operating Area are also achieved by the second embodiment because of the similarity to the case of the emitter-open turn off. The MOS-controlled thyristor of the second embodiment, like the first embodiment, also has a lower forward voltage drop than an IGBT for the same current for higher breakdown voltage (>1200 V) devices, and requires no short circuit protection because of its on-state current saturation characteristics, described previously. Also, advantageously, the second embodiment does not have any parasitic thyristor structure found in EST to degrade performance, and has a uniform turn-off process as compared to a MCT.

Figure 6A:
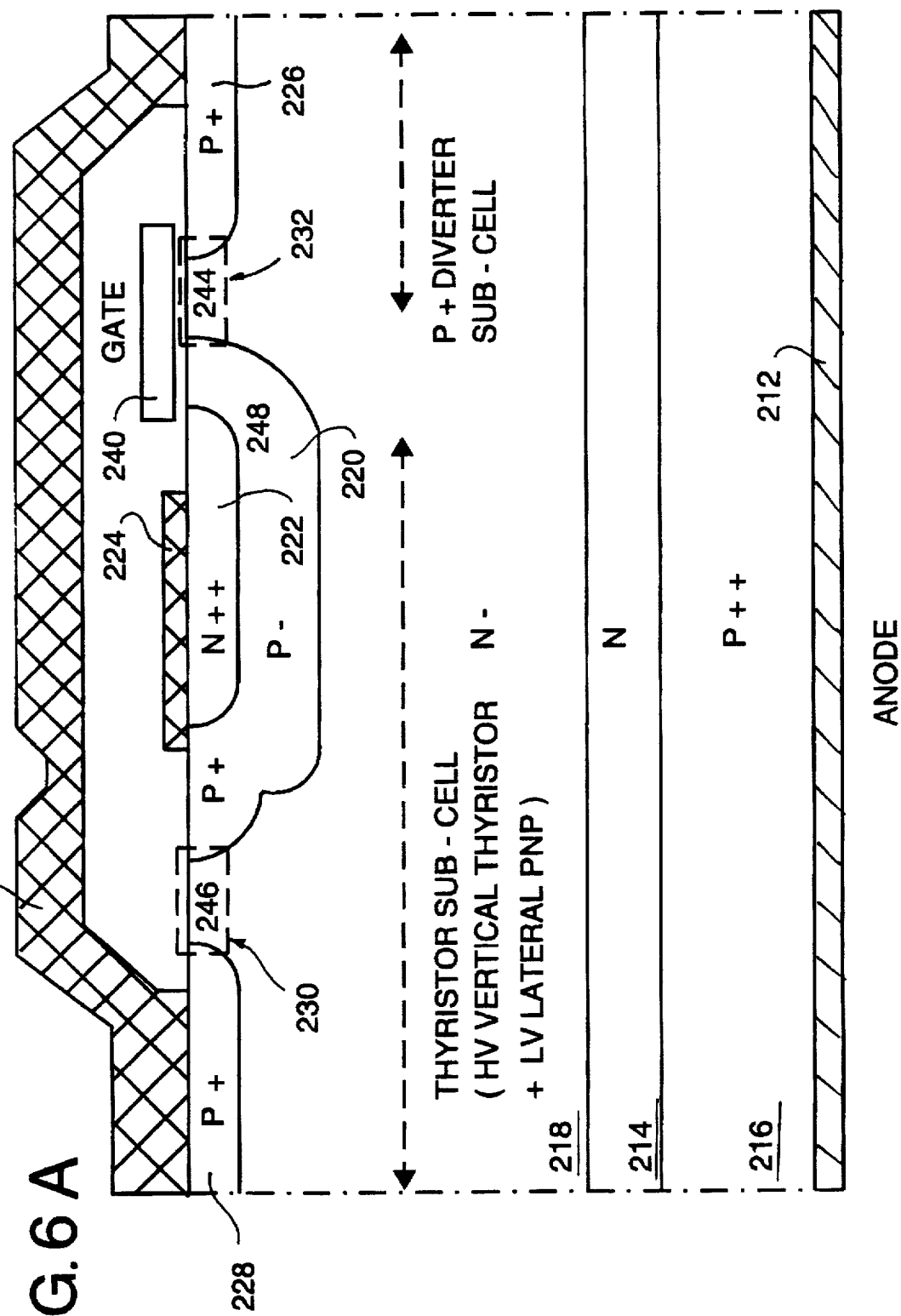
FIG. 6A is a cross-sectional view of a variation of the second embodiment of the invention in which a PNP punch-through structure is in series with the $N^+$ emitter.

FIG. 6A shows a variation of the second embodiment where the turn-on PMOS 246 in FIG. 6 is replaced by a punch-through PNP structure consisting of regions 228, 230 and 220.

Figure 8A:
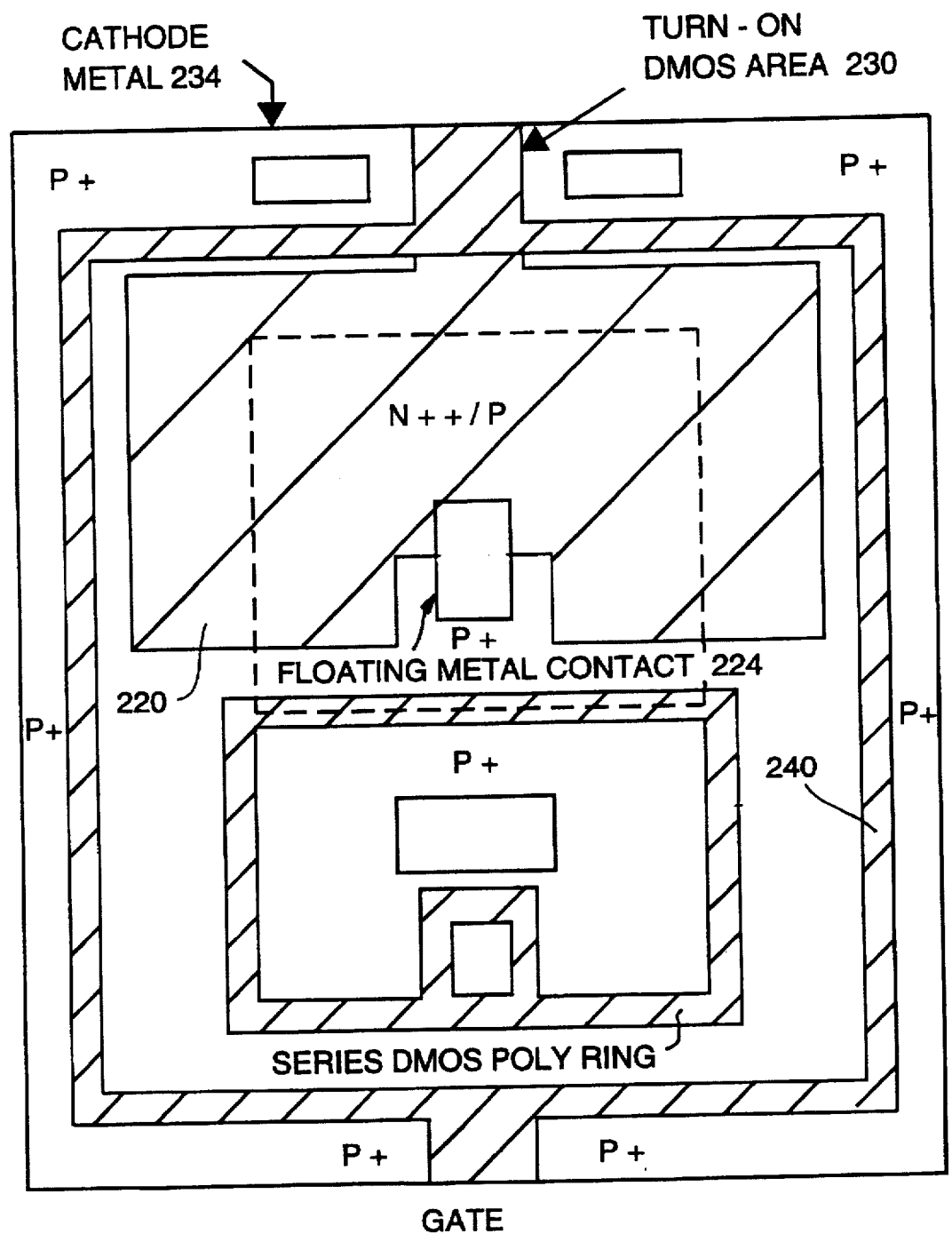
FIGS. 8A and 8B show preferred layouts for the second embodiment of FIGS. 6 and 6A, respectively, of the present invention.
Figure 8B:
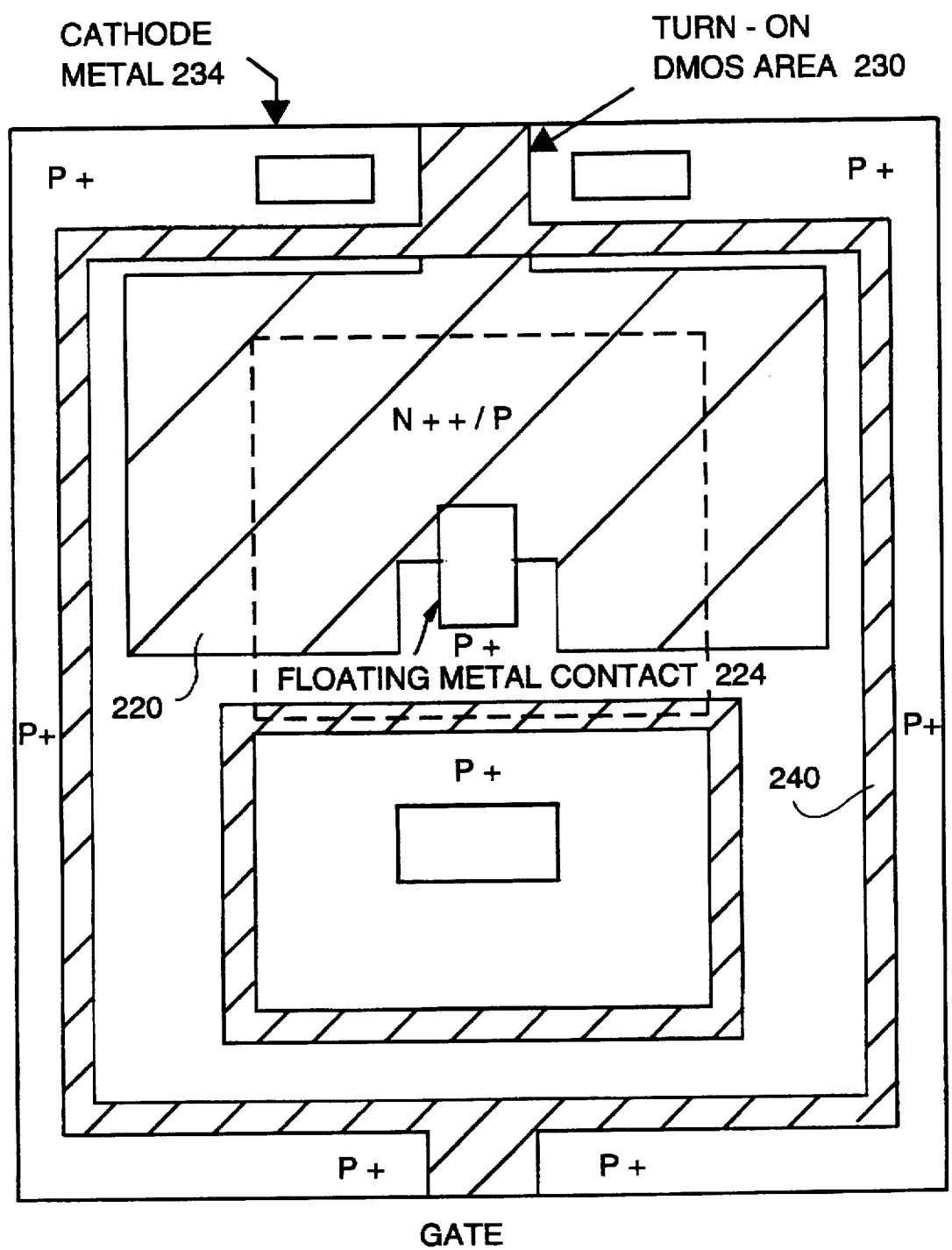
Figure 9A:
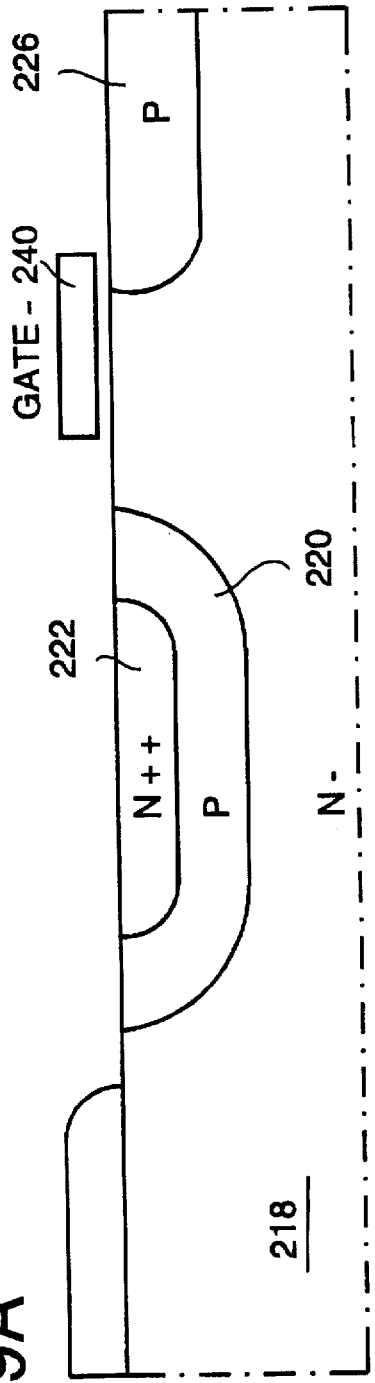
FIGS. 9A–9D show the basic steps for fabricating the second embodiment of FIG. 6A of the present invention.
Figure 9B:
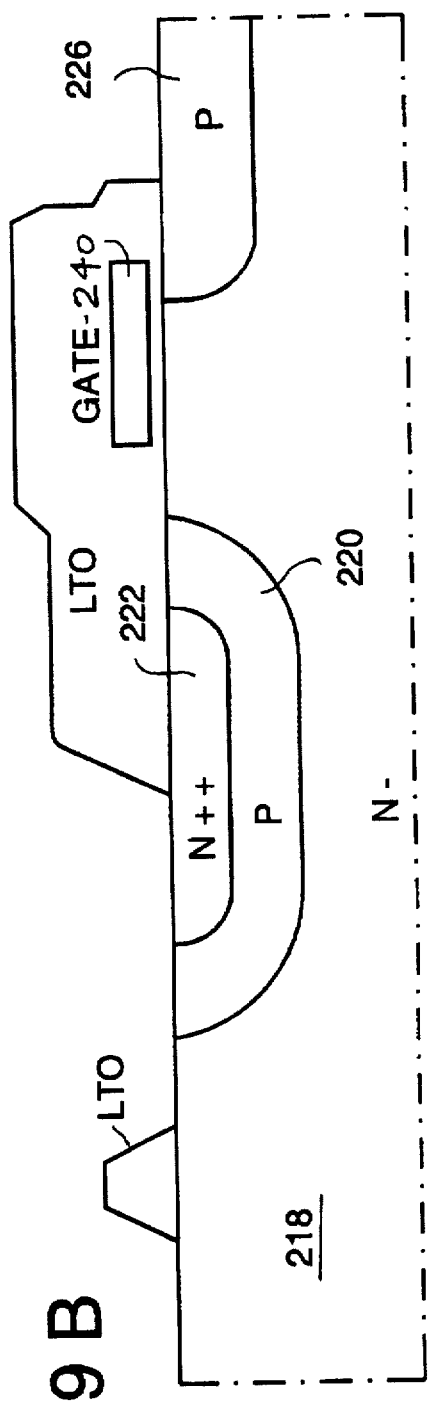
Figure 9C:
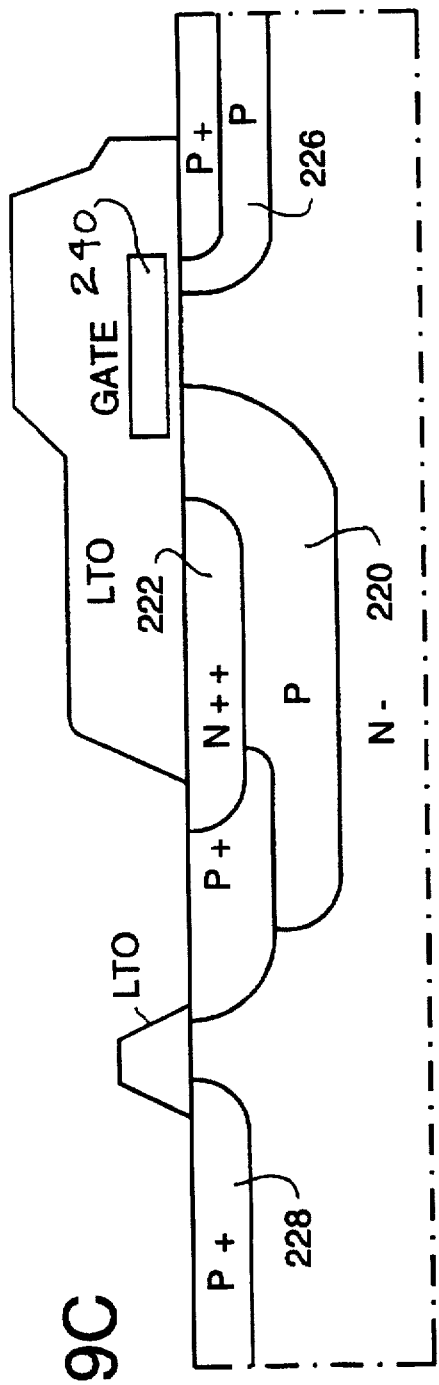
Figure 9D:
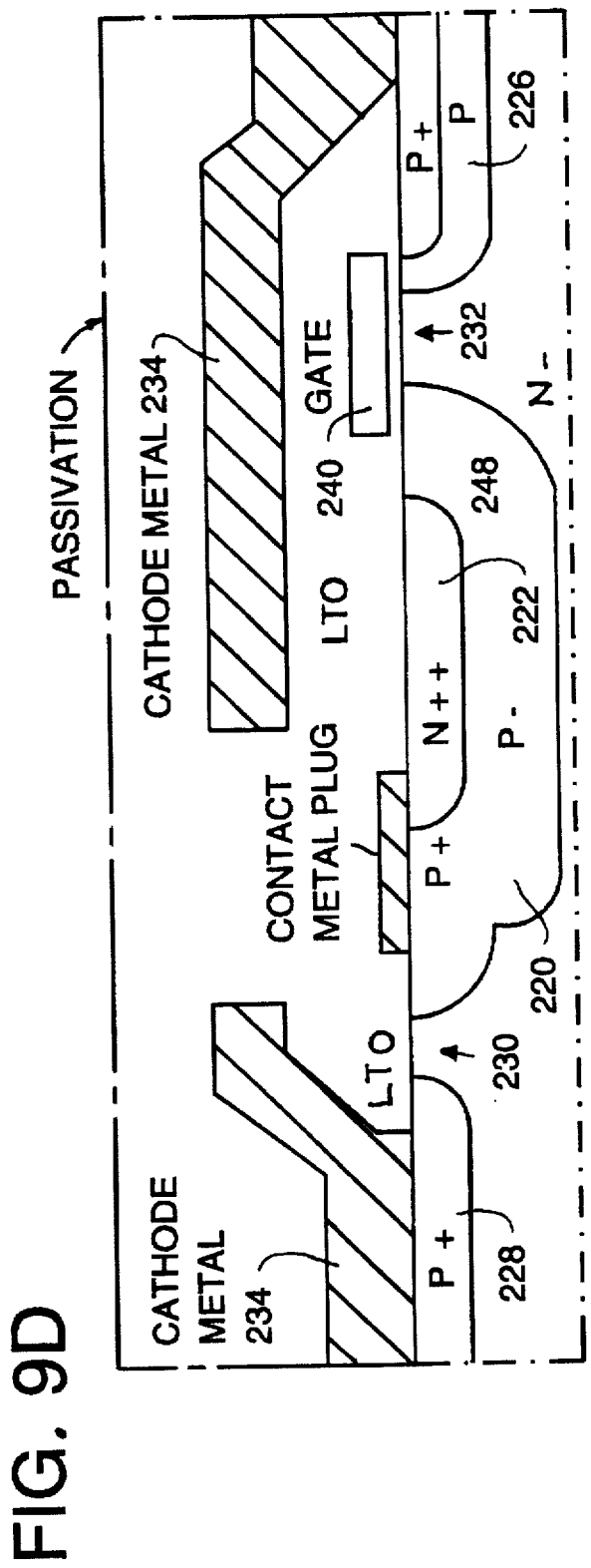

Preferred layouts for the embodiments of FIG. 6 and FIG. 6A of the invention are shown in FIGS. 8A and 8B, respectively. The main fabrication steps of the structure of FIG. 6A are shown in FIGS. 9A–9D.

Figure 10:
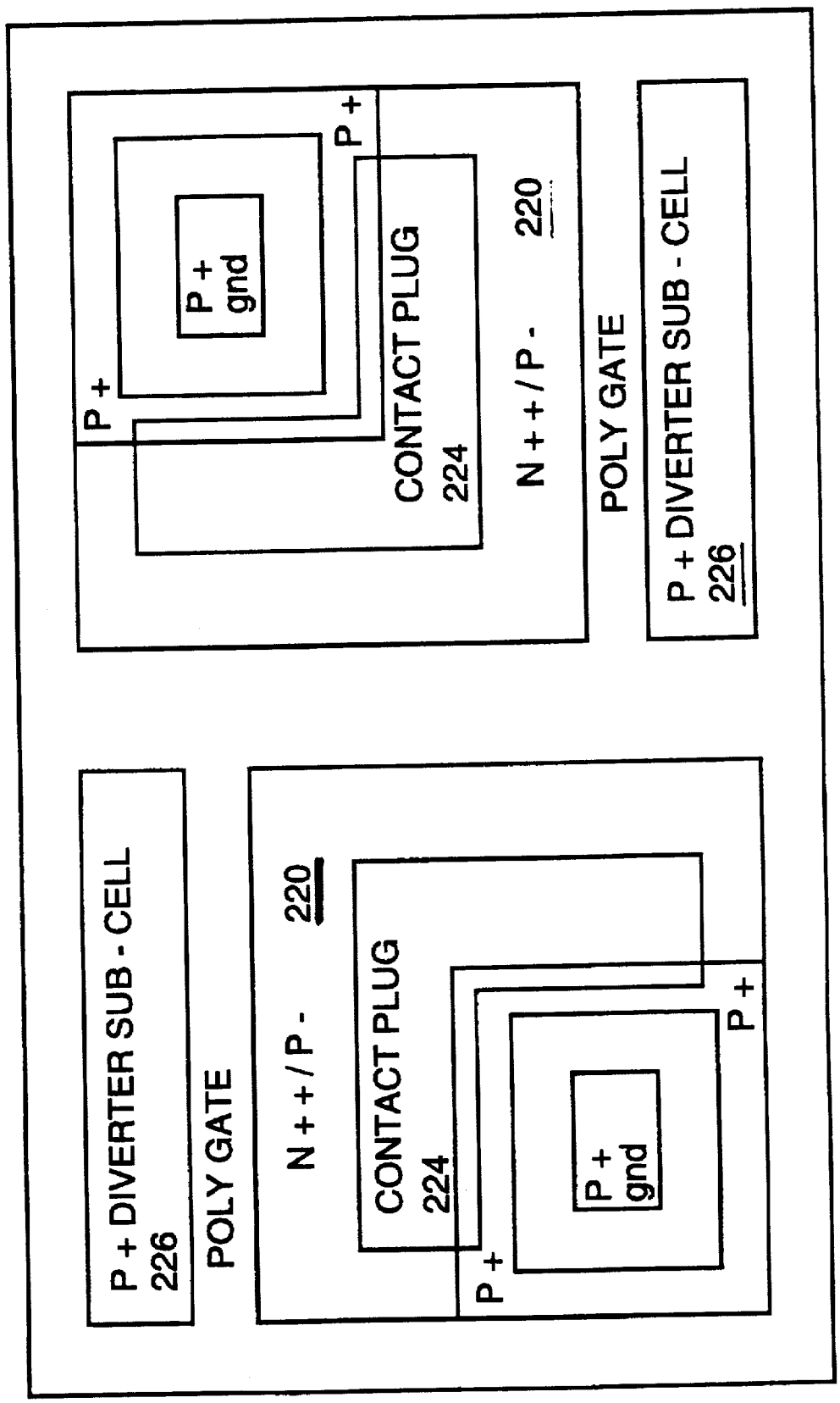
FIG. 10 shows a cellular implementation of the second embodiment of the invention.

A cellular implementation of the second embodiment of the invention, showing two cells side-by-side, is depicted in FIG. 10. The thyristor sub-cell shown in FIG. 10 includes the high voltage vertical thyristor and the low voltage turn-on PMOS 246. The $P^+$ diverter sub-cell is the $P^+$ cathode region 226 of FIG. 6.

The first and second embodiments of the invention (the FIG. 2 and FIG. 6 structures) rely upon the lateral voltage drop along the P base to forward-bias the NPN transistor to latch the thyristor. Consequently, the P base must be made relatively long with light doping.

Figure 11:
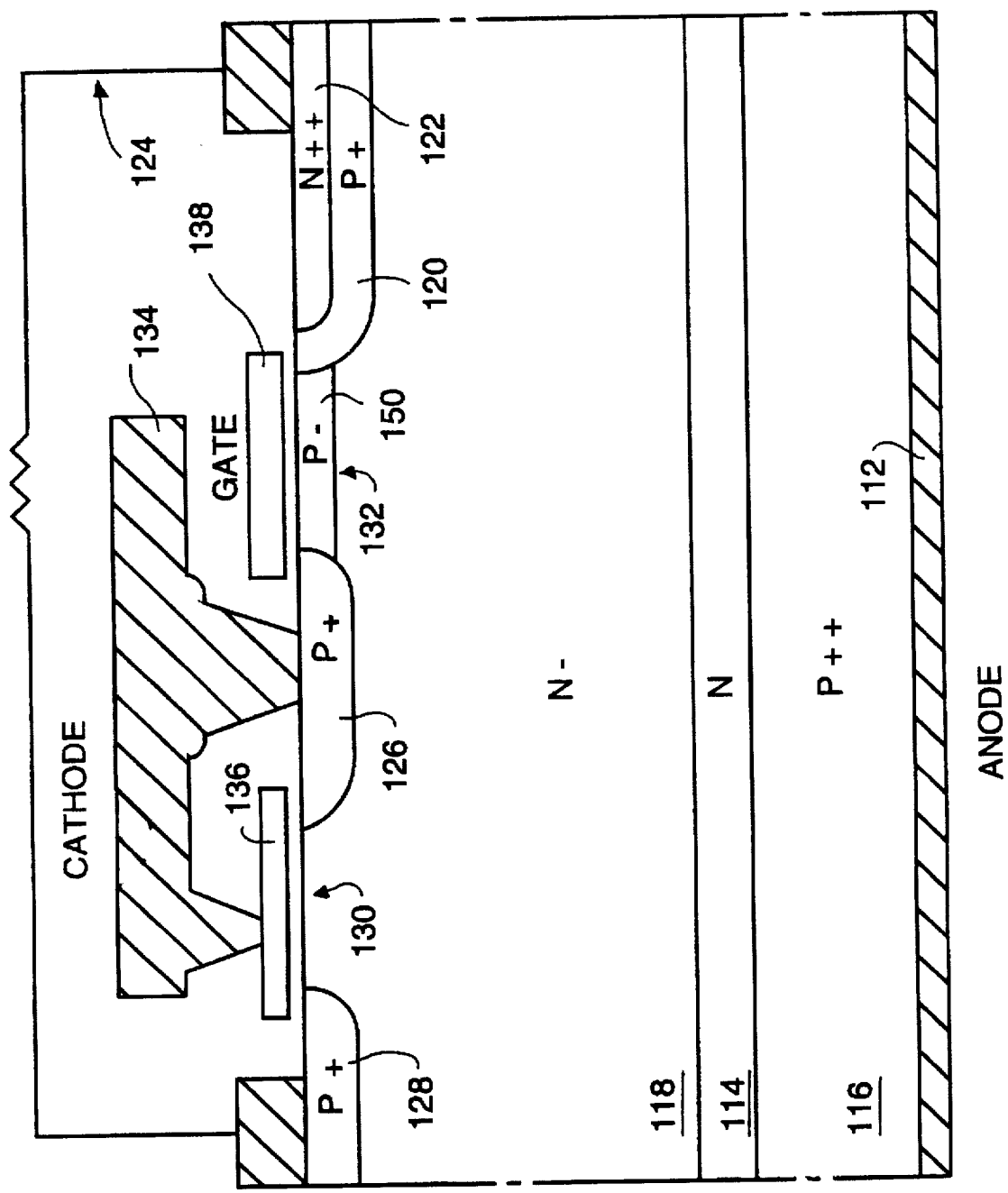
FIG. 11 shows the addition of a P-diffusion in some regions of the multi-cell first embodiment structure.
Figure 12:
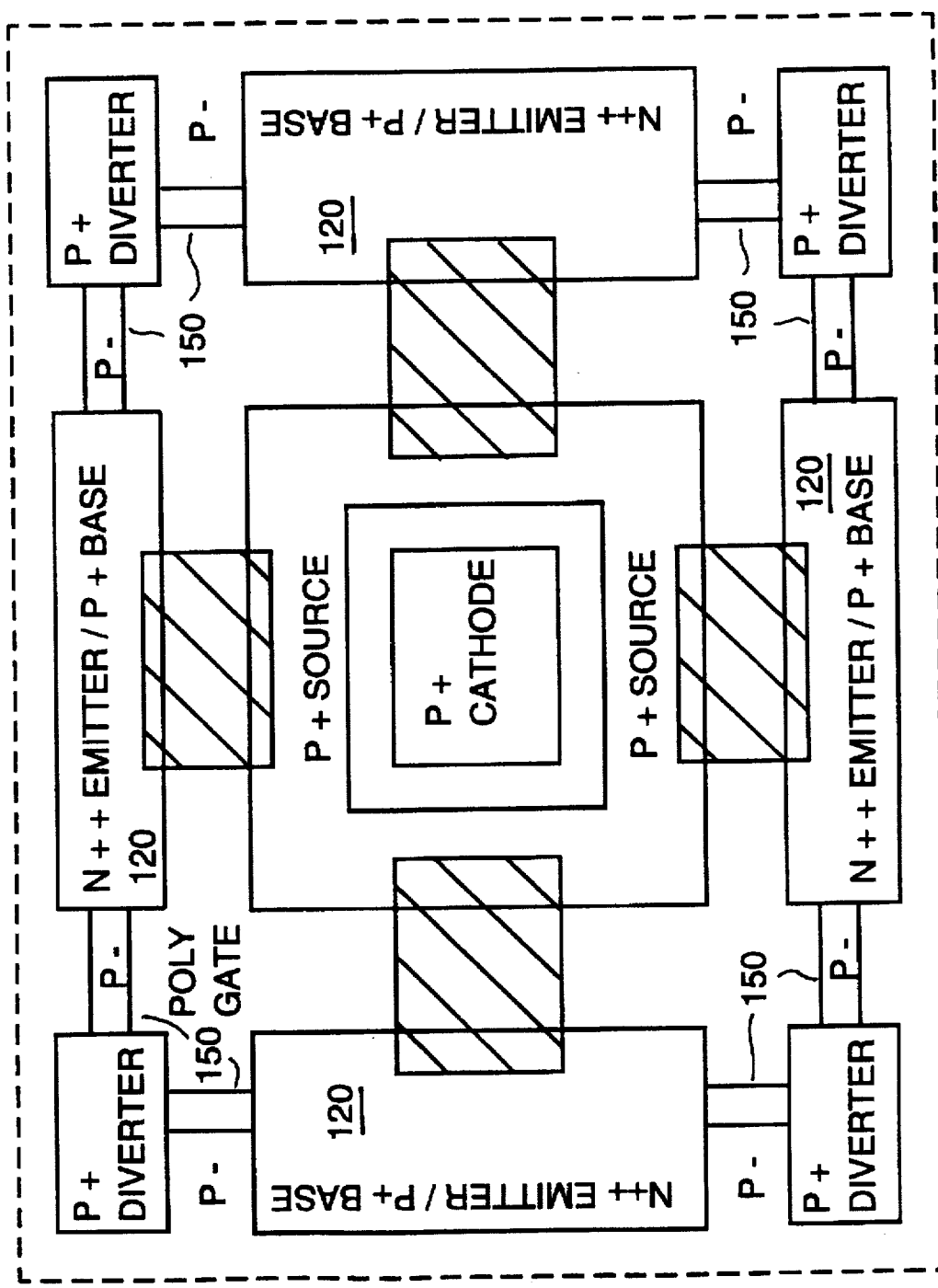
FIG. 12 shows a top view of the FIG. 11 structure.

An option for reducing $N^+$ emitter length is to add a $P^-$ diffusion 150 in some regions of the multi-cell structure under the gate overlying the channel between the P base and the $P^+$ cathode, thereby adding a MOS gate controlled resistance path. This structure, shown in FIG. 11 as implemented in the first embodiment of the invention, enables a smaller $N^+$ emitter length for the same latching density and thus leads to higher cell density for the structure. FIG. 12 shows the top view of the modified structure.

Figure 13:
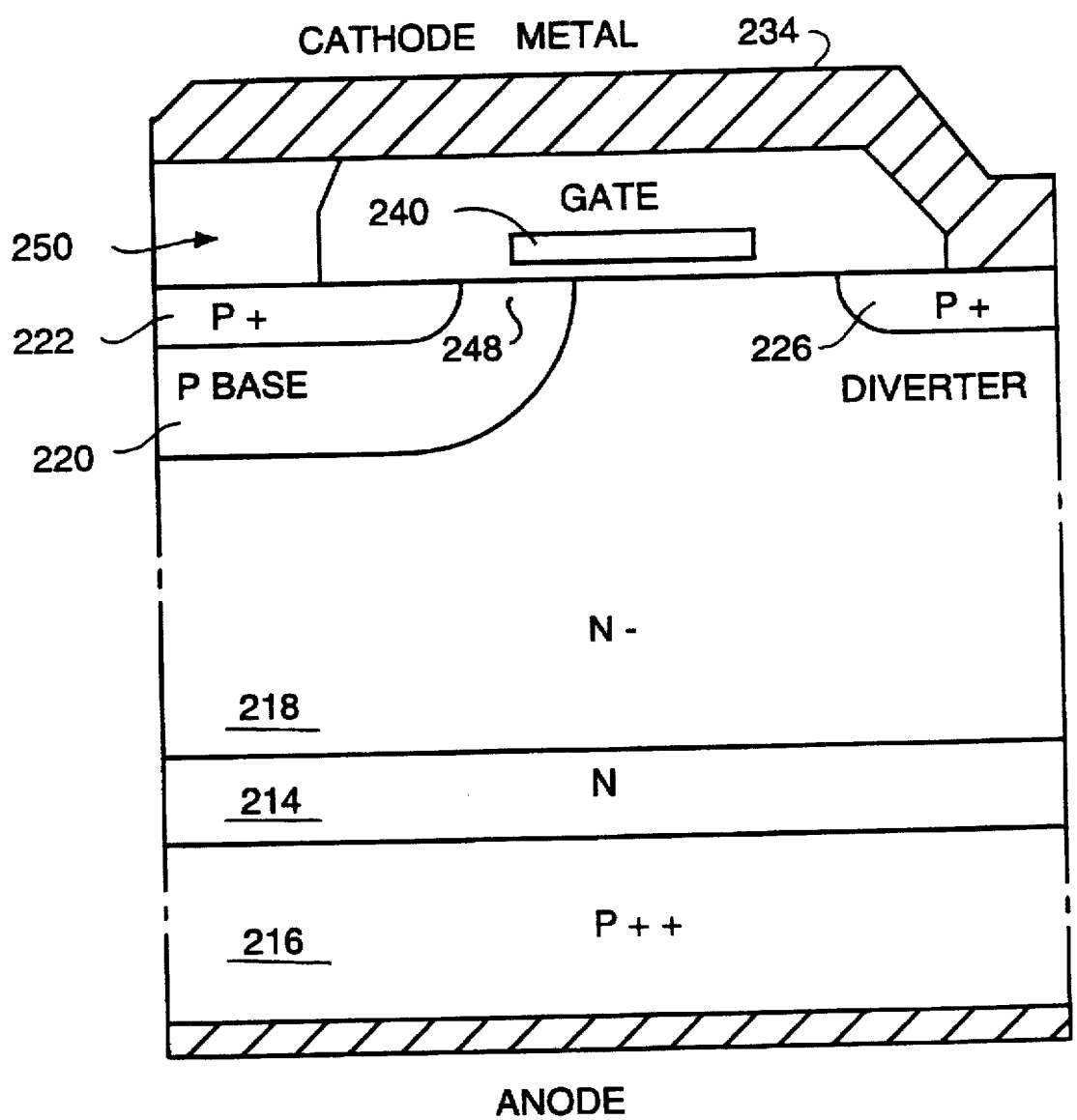
FIG. 13 shows the implementation of a series polysilicon resistor added to the thyristor structure.
Figure 14:
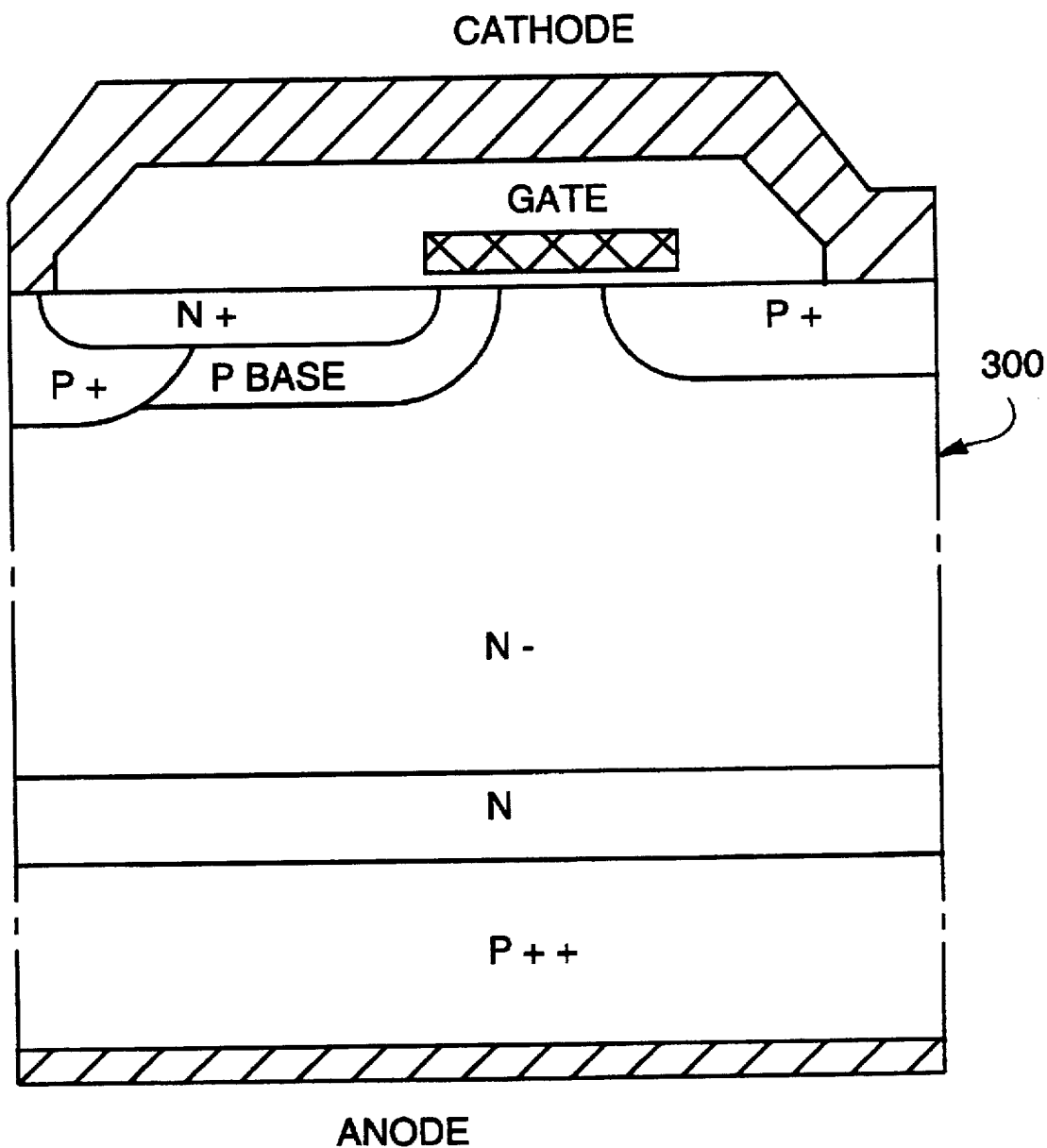
FIG. 14 shows an embodiment of the invention with resistive current flow along the $N^+$ emitter.
Figure 15:
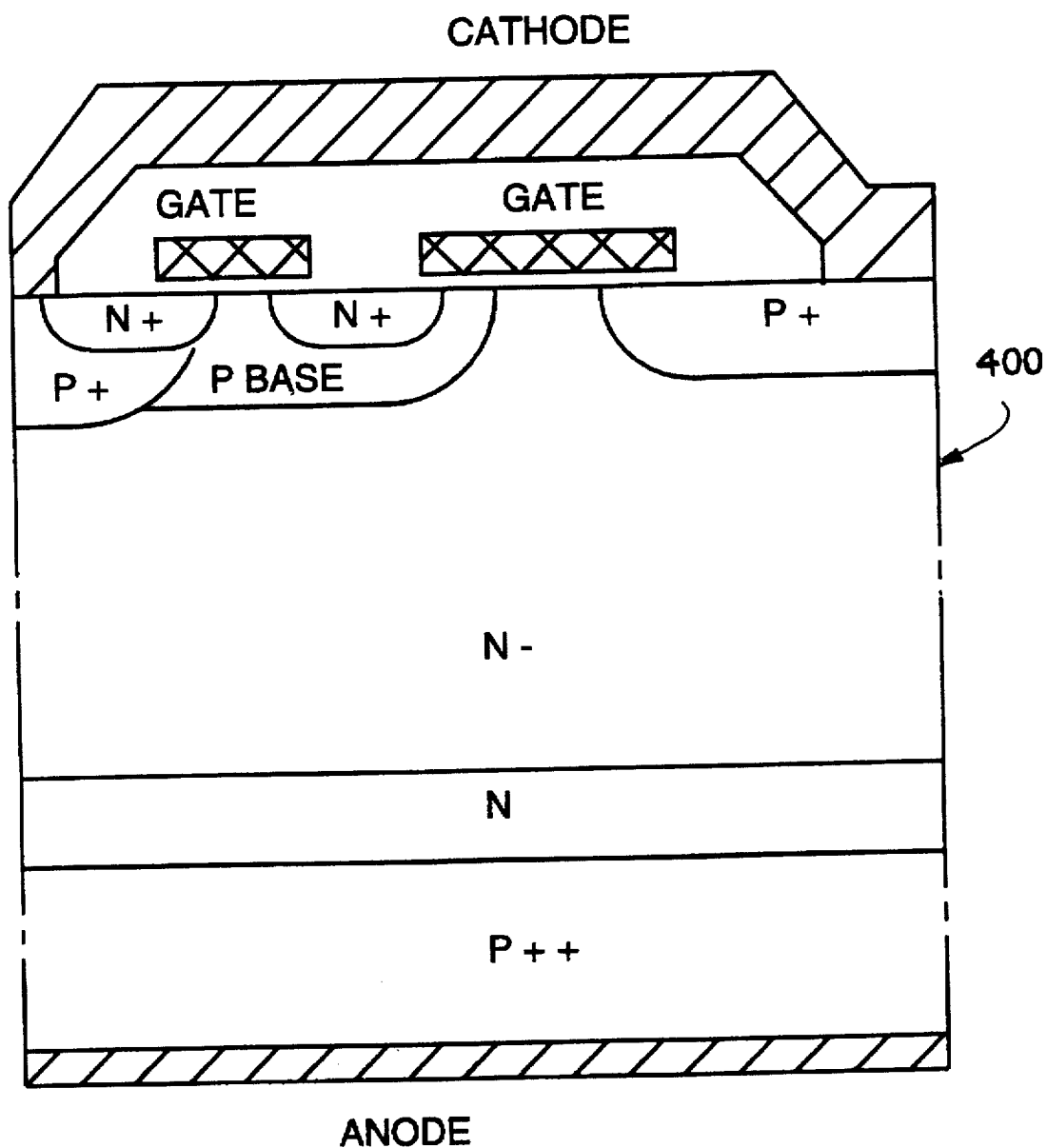
FIG. 15 shows an emitter-switched embodiment of the invention.

Alternative embodiments of the invention, both of which operate on the principle of the FIG. 2 and FIG. 6 embodiments, are shown in FIGS. 13, 14, 15, 16 and 17. FIG. 13 shows an embodiment with an $N^-$ polysilicon resistor 250 in series with the $N^+$ emitter. The polysilicon resistor 250 is formed by depositing $N^-$ polysilicon in the contact window of the $N^+$ emitter. FIG. 14 shows an alternative embodiment using $N^+$ resistance and/or $N^+$ contact resistance in series with the $N^+$ emitter, whereas FIG. 15 shows an alternative emitter-switched embodiment using a NMOS and/or punch through NPN transistor in series with the $N^+$ emitter. In the structure of FIG. 15, the N-channel lateral MOSFET provides the resistive potential drop for the $N^+$ emitter. The device embodiment of FIG. 15 can advantageously be turned-off just by reducing the gate voltage to zero.

Figure 16:
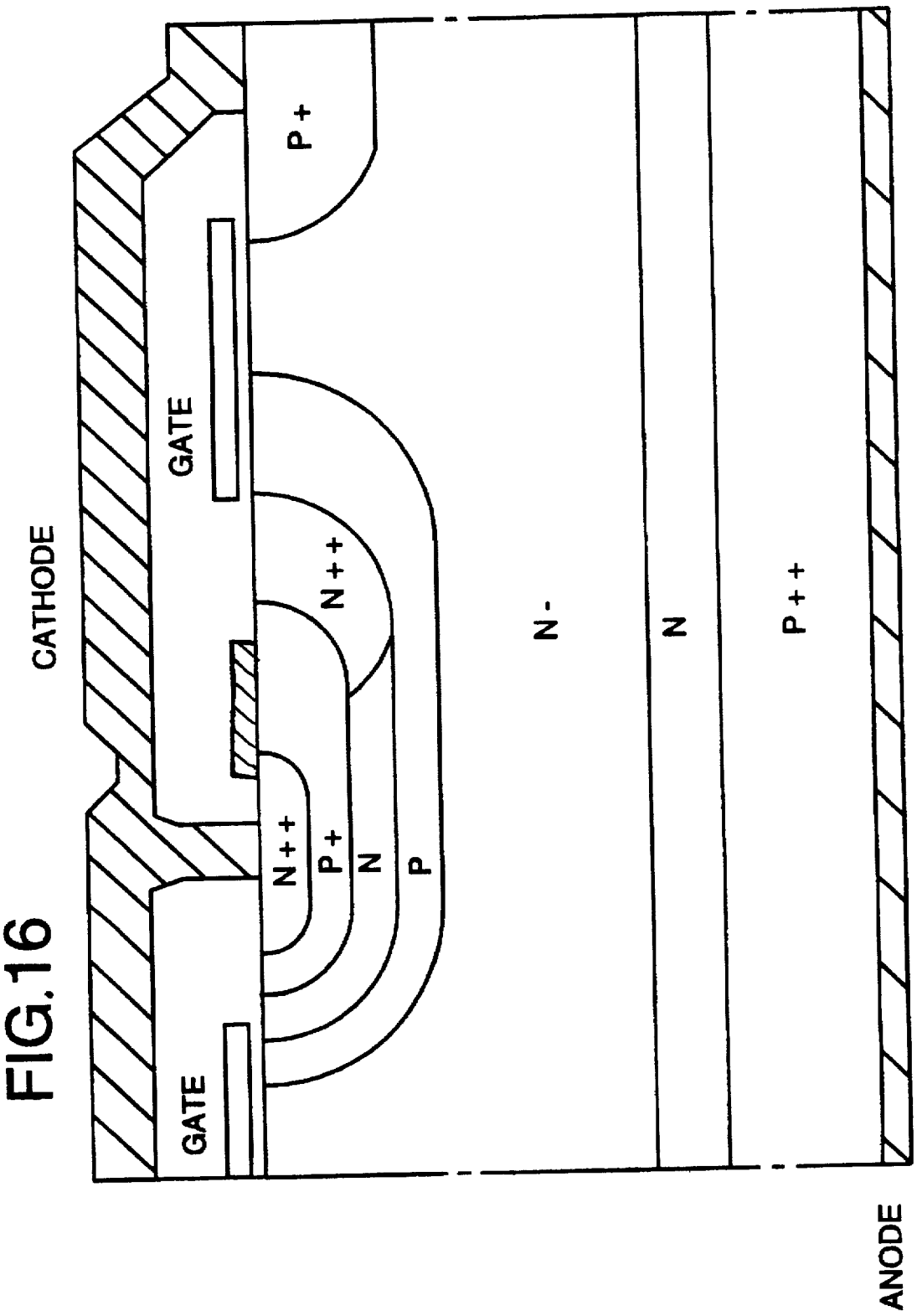
FIG. 16 shows the implementation of a PN junction diode in series with the $N^+$ emitter of the thyristor.
Figure 17:
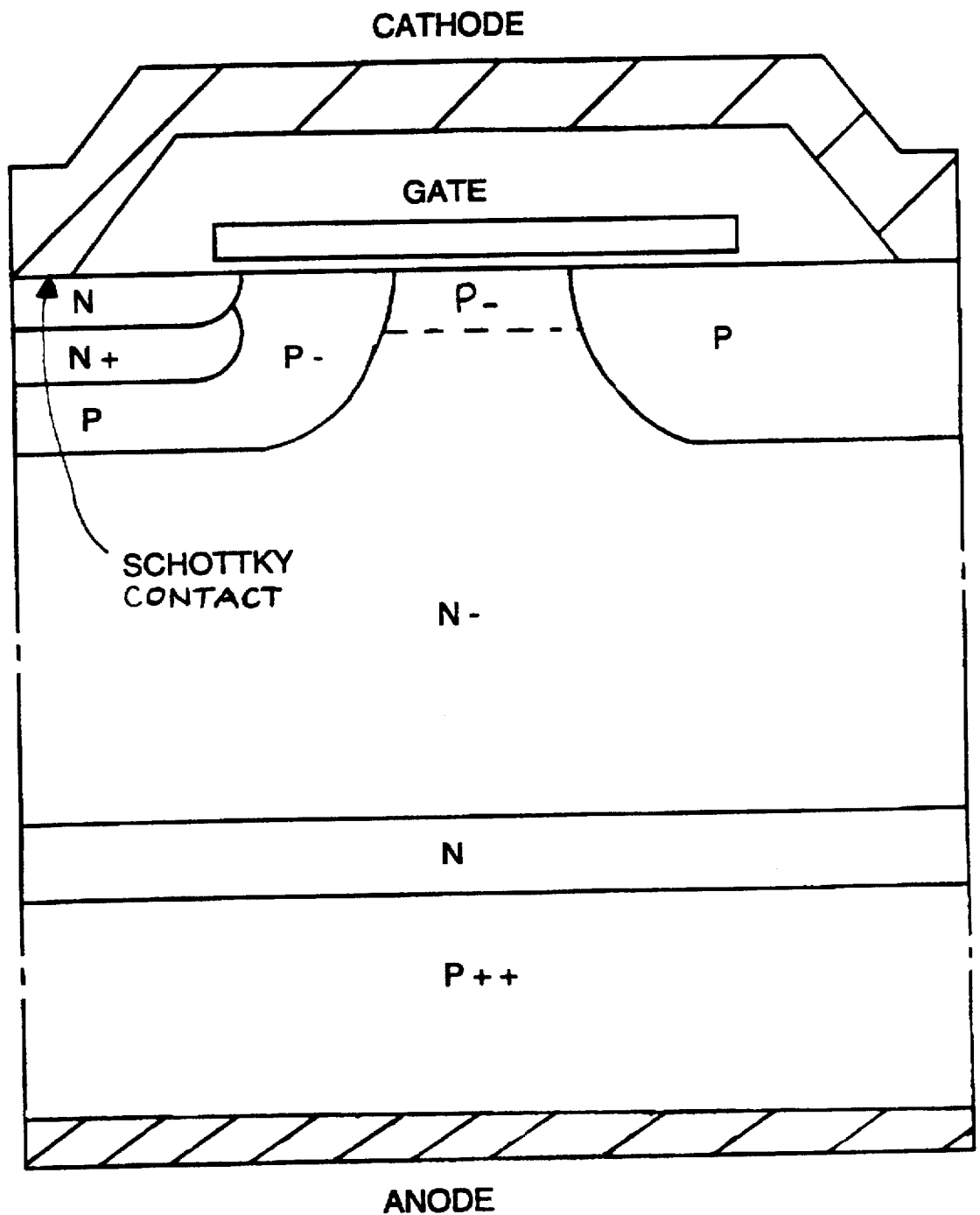
FIG. 17 shows the implementation of a Schottky diode in series with the $N^+$ emitter of the thyristor.

FIG. 16 shows an embodiment with a PN junction diode in series with the $N^+$ emitter while FIG. 17 shows an embodiment with a Schottky diode in series with the $N^+$ emitter.

Figure 18:
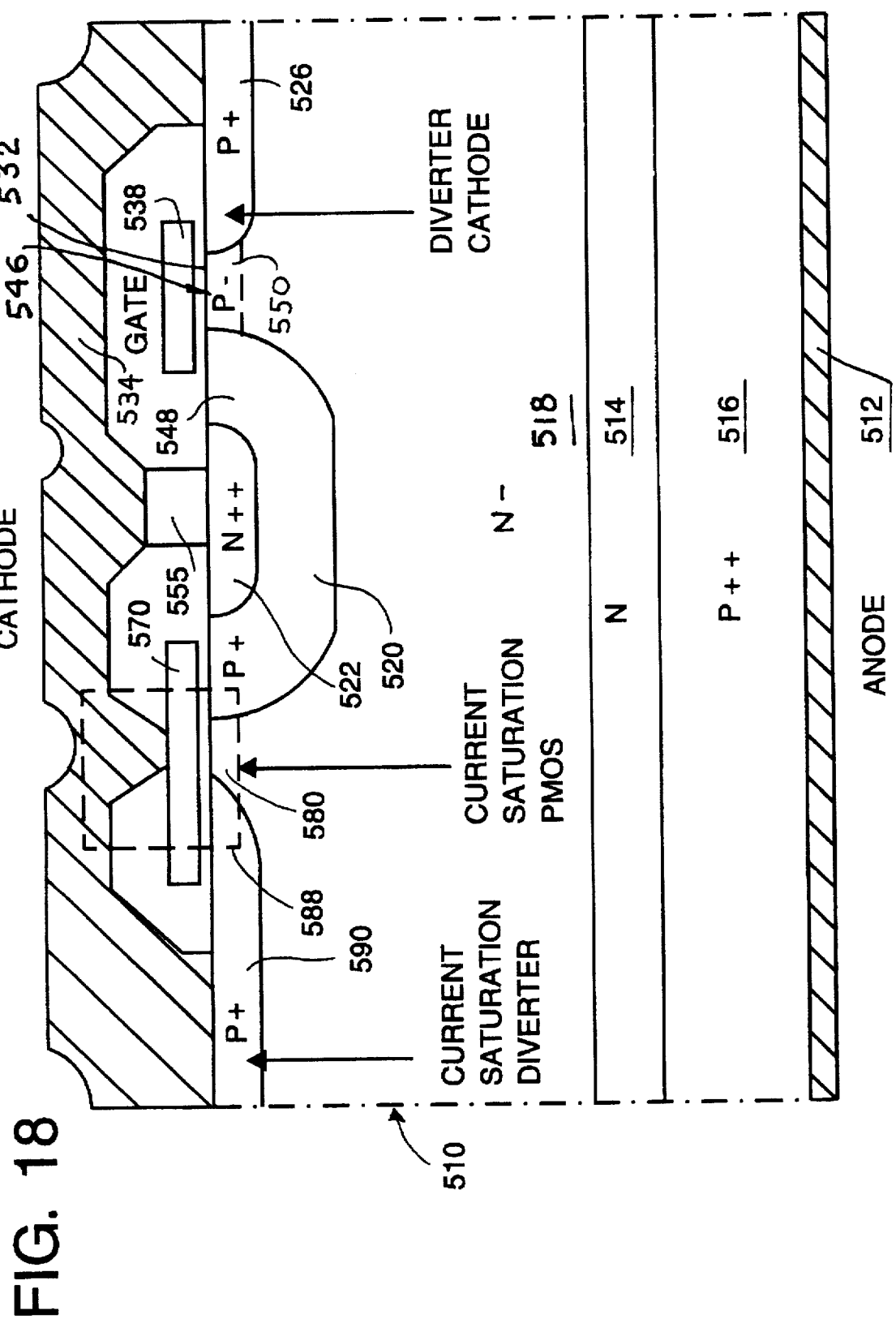
FIG. 18 shows a structure in which current saturation is obtained by activation of a PMOS and in which the $N^+$ emitter of the thyristor has a resistor in series.
Figure 18:
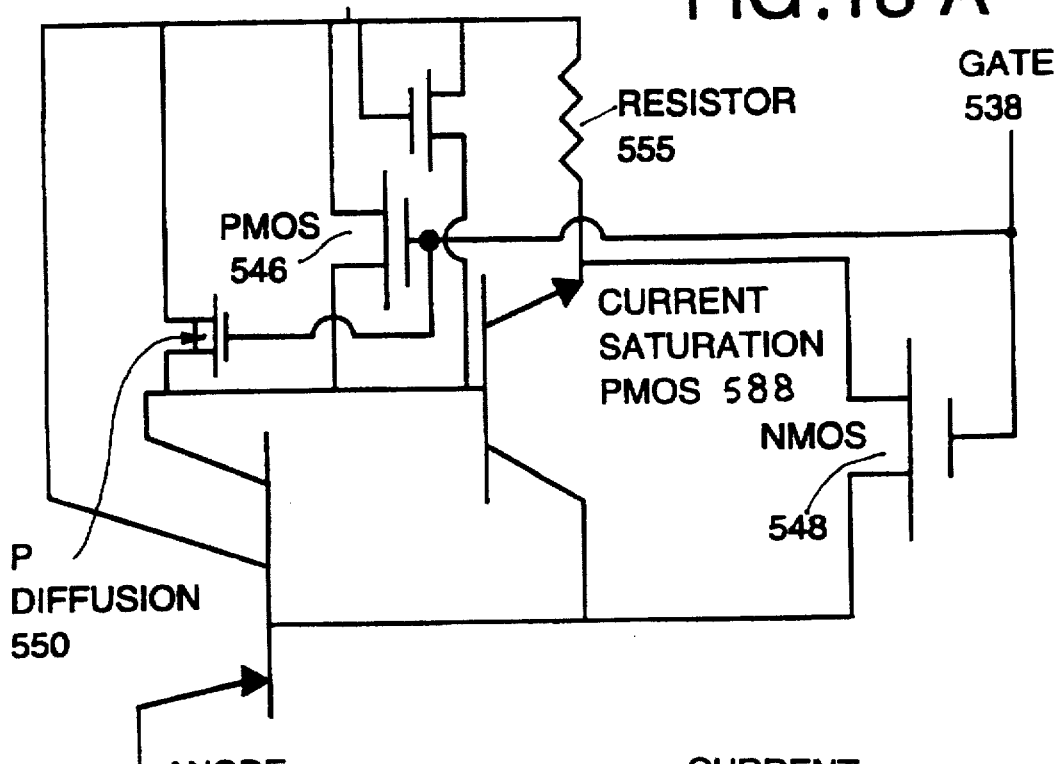

A cross-sectional view of another embodiment of the MOS-controlled thyristor of the present invention is shown in FIG. 18. MOS-controlled thyristor 510 is a vertical conduction device.

Each half-cell of the device of FIG. 18 consists of a resistor in series with a high-voltage vertical $P^{++}NN^-PN^+$ thyristor structure. The N-type layer 514 and a very highly doped $P^{++}$ emitter region 516 are disposed on the underside of an $N^-$ layer 518. For lower voltage applications (<1200 V), $N^-$ layer 518 is preferably epitaxially grown on an N epi/$P^{++}$ substrate. For higher voltage applications (>1200 V), $N^-$ layer 518 is preferably the starting substrate material and N layer 514 and $P^{++}$ region 516 are backside diffusions. The layer thicknesses and concentrations are similar to those of the previously described embodiments.

An anode electrode 512 on the bottom surface of the device covers $P^+$ region 516. Anode electrode 512 is coupled to an anode terminal.

Disposed within $N^-$ layer 518 is a P-type base 520. An $N^+$ emitter region 522 is disposed within P base 520. Two additional P-type regions extend into the chip from the upper surface of the device, namely $P^+$ cathode region 526 and $P^+$ region 590. $P^+$ region 590 and P base region 520 are separated from each other by a relatively small region of $N^-$ layer 518 which extends to the surface of the wafer to form a first channel region 580, which serves as the channel of a lateral "current-saturation" PMOS 588. Similarly, P base region 520 is separated from $P^+$ cathode region 526 by a relatively small region of $N^-$ layer 518 which extends to the surface of the wafer to form a second channel region 532, which serves as the channel of a turn-off PMOS 546.

$N^+$ emitter region 522 of the thyristor is in series with a resistor 555. A cathode electrode 534 contacts the resistor 555 and the $P^+$ cathode. The cathode electrode 534 also contacts the drain 590 of PMOS 588 and also the gate 570 of PMOS 588. The end of the $N^+$ emitter/P base junction adjacent to $P^+$ cathode 526 incorporates a DMOS structure which forms an n-channel MOSFET 548 to turn-on the thyristor. A gate electrode 538 overlies n-channel DMOSFET 548 and the turn-off p-channel MOSFET 546. Gates 570 and 538 are preferably comprised of polysilicon and are insulated from the upper surface of the device by a layer of oxide (not shown in FIG. 18).

The equivalent circuit of the device of FIG. 18 is shown in FIG. 18A. In the on-state, with anode at a positive potential with respect to the cathode and the voltage on gate electrode 538 sufficiently positive to turn-on the n-channel DMOSFET 548, the base drive for the vertical PNP transistor is provided through the n-channel MOSFET 548 under gate electrode 538.

When the $P^{++}$ emitter/$N^-$ epi junction is forward biased by about 0.7 volts, the $P^{++}$ emitter 516 starts injecting holes which supplies the base drive for the NPN transistor causing the thyristor to go into the latched state. Current now flows through the thyristor in series with the resistor 555.

At high currents, the increase in voltage drop across the thyristor section is almost negligible and the resistor 555 limits the current with the voltage drop (V) across the resistor 555 increasing linearly with the current (I). It is possible to obtain current saturation capability in the device of the present invention at a predetermined high current as described as follows with respect to an n-channel device.

When operating at high currents, because of the voltage drop in resistor 555, the potential of the $N^+$ emitter 522 and, along with it, the potential of the P base region 520 increases. When the potential is increased beyond threshold voltage of PMOS 588, the PMOS 588 starts conducting, diverting hole current. This creates an additional path for holes to flow from P base region 520, reducing the resistance of the P base region 520. The reduction of resistance of P base region 520 leads to decrease in the thyristor current. But as soon as the thyristor current decreases, the voltage drop of the resistor 555 decreases and consequently a reduction of potential of the N⁺ emitter 522 and the P base 520. This takes P base 520 out of the low resistance situation causing increase in the effective P base resistance in a negative feedback mechanism. This negative feedback mechanism leads to current saturation in the device.

The thyristor can be turned-off by reducing the gate electrode voltage from positive to negative to activate the lateral PMOS 546 from the P base 520 to the P⁺ cathode 526. The negative feedback mechanism described earlier reduces the risk of current crowding.

A P⁻ diffusion 550 is preferably added in some regions of the multi-cell structure under the gate 538 overlying the channel between the P base 520 and P⁺ cathode 526, thereby adding a MOS gate controlled resistance path.

Figure 19:
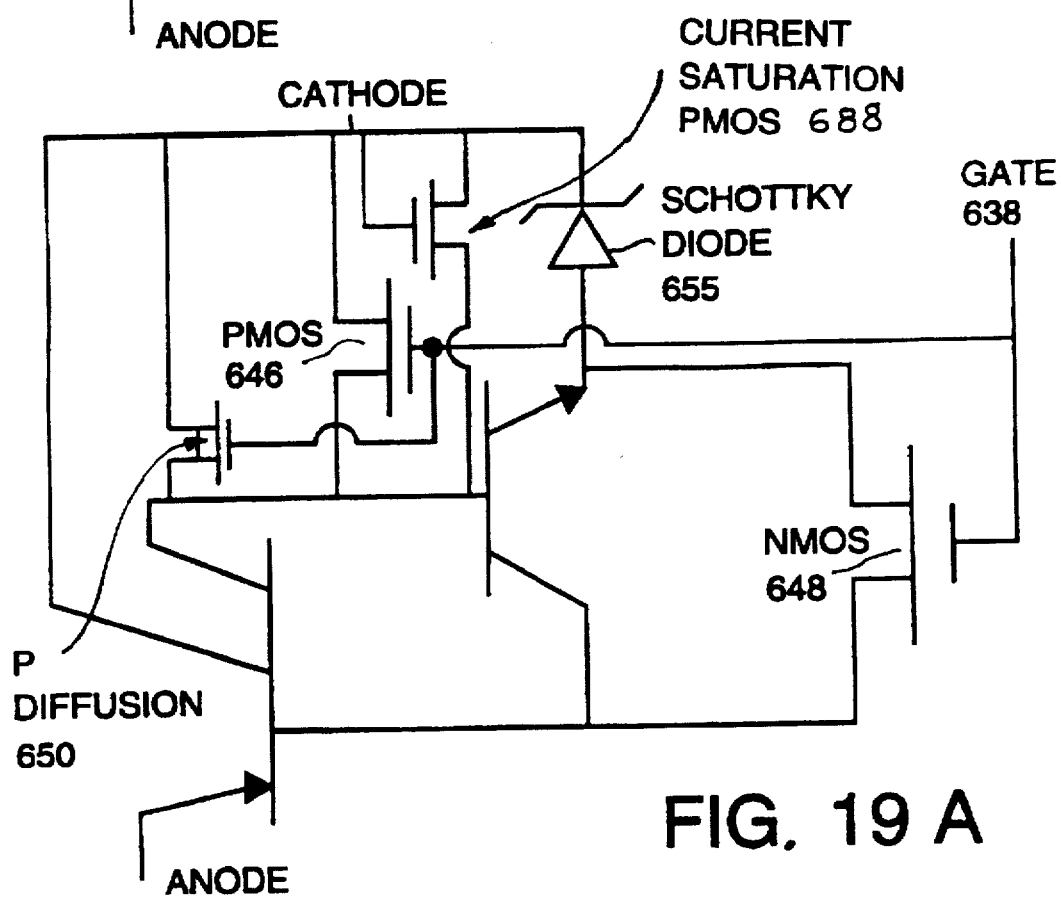
FIG. 19 shows another embodiment of the invention in which current saturation is obtained by activation of a PMOS and wherein the $N^+$ emitter of the thyristor has a Schottky diode in series.
Figure 19:
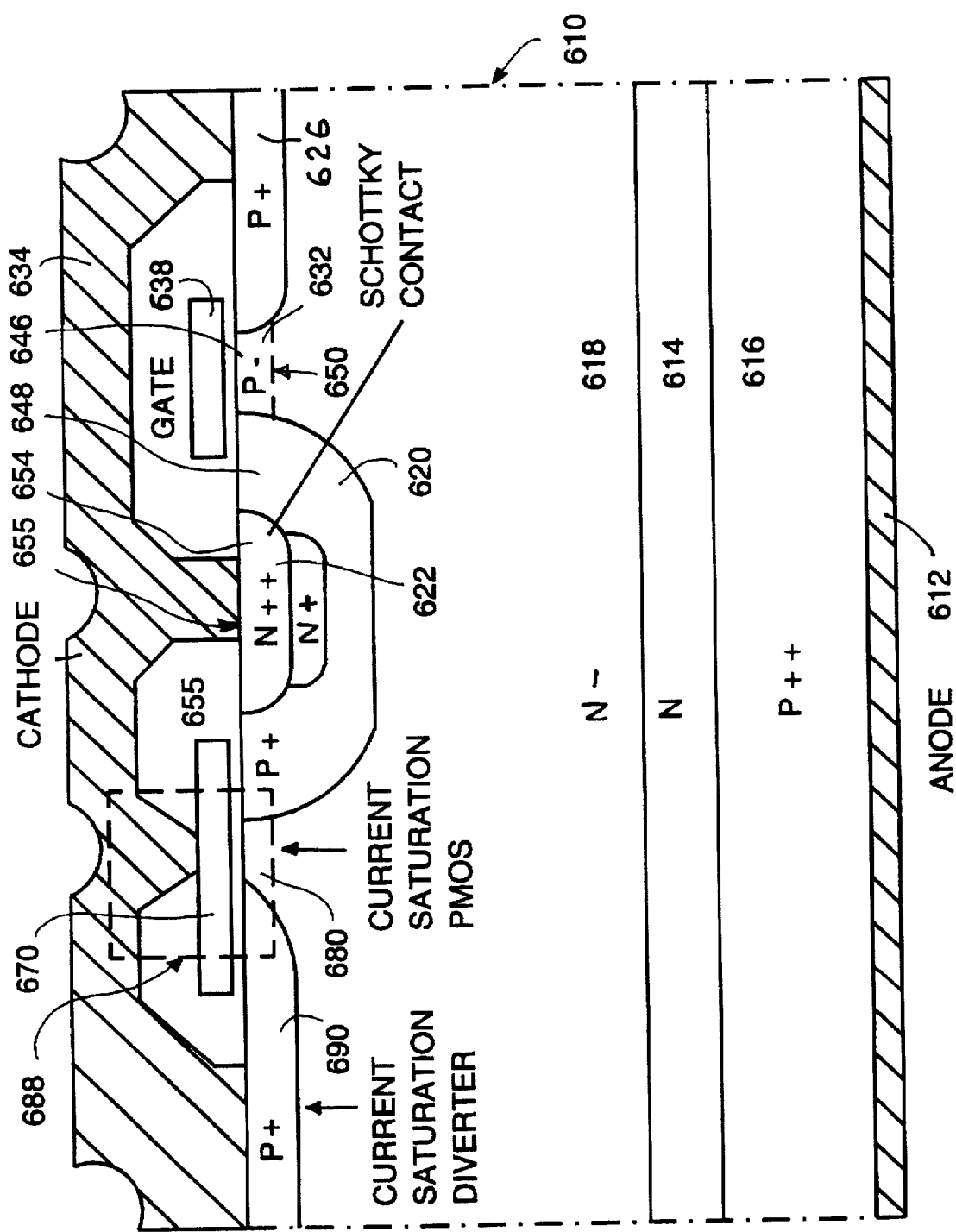

A cross-sectional view of another embodiment of the MOS-controlled thyristor of the present invention is shown in FIG. 19. MOS-controlled thyristor 610 is a vertical conduction device.

Each half-cell of the device of FIG. 19 consists of a Schottky diode in series with a high-voltage vertical P⁺⁺NN⁻PN⁺⁺ thyristor structure. The N-type layer 614 and a very highly doped P⁺⁺ emitter region 616 are disposed on the underside of an N⁻ layer 618. For lower voltage applications (<1200 V), N⁻ layer 618 is preferably epitaxially grown on an N epi/P⁺⁺ substrate. For higher voltage applications (>1200 V), N⁻ layer 618 is preferably the starting substrate material and N layer 614 and P⁺⁺ region 616 are backside diffusions. The layer thicknesses and concentrations are similar to those of the previously described embodiments.

An anode electrode 612 on the bottom surface of the device covers P⁺ region 616. Anode electrode 612 is coupled to an anode terminal.

Disposed within N⁻ layer 618 is a P-type base 620. An N⁺ emitter region 622 is disposed within P base 620. Two additional P-type regions extend into the chip from the upper surface of the device, namely P⁺ cathode region 626 and P⁺ region 690. P⁺ region 690 and P base region 620 are separated from each other by a relatively small region of N⁻ layer 618 which extends to the surface of the wafer to form a first channel region 680, which serves as the channel of a lateral "current-saturation" PMOS 688. Similarly, P base region 620 is separated from P⁺ cathode region 626 by a relatively small region of N⁻ layer 618 which extends to the surface of the wafer to form a second channel region 632, which serves as the channel of a turn-off PMOS 646.

N⁺ emitter region 622 of the thyristor is in series with a Schottky diode formed by an N region 654 under a Schottky contact metal 655. A cathode electrode 634 contacts Schottky contact metal 655, P⁺ cathode 626, drain 690 of PMOS 688 and also the gate 670 of PMOS 688. The end of the N⁺ emitter/P base junction adjacent to P⁺ cathode 626 incorporates a DMOS structure which forms an n-channel MOSFET 648 to turn-on the thyristor. A gate electrode 638 overlies n-channel DMOSFET 648 and the turn-off p-channel MOSFET 646. Gates 670 and 638 are preferably comprised of polysilicon and are insulated from the upper surface of the device by a layer of oxide (not shown in FIG. 19).

In the on-state, with anode at a positive potential with respect to the cathode and the voltage on gate electrode 638 sufficiently positive to turn-on the n-channel DMOSFET 648, when the anode voltage is increased, the potential of N region 654 increases activating the Schottky diode 655. In this situation, the N⁺ emitter 622 is connected to ground potential through the Schottky diode 655 and the base drive for the vertical PNP transistor is provided through the n-channel MOSFET 648 under gate electrode 638.

When the P⁺⁺ emitter/N⁻ epi junction is forward biased by about 0.7 volts, the P⁺⁺ emitter 616 starts injecting holes which supplies the base drive for the NPN transistor causing the thyristor to go into the latched state. Current now flows through the thyristor in series with the Schottky diode 655.

At high currents, the voltage drop (V) across the Schottky diode 655 increases with the current (I). It is possible to obtain current saturation capability in the device of the present invention at a predetermined high current as described as follows with respect to an n-channel device.

When operating at high currents, because of the voltage drop in Schottky diode 655, the potential of the N⁺ emitter 622 and, along with it, the potential of the P base region 620 increases. When the potential is increased beyond the threshold voltage of PMOS 688, the PMOS 688 starts conducting and thereby diverting hole current. This creates an additional path for holes to flow from the P base region 620, reducing the resistance of the P base region 620. The reduction of resistance of the P base region 620 leads to decrease in the thyristor current. As soon as the thyristor current decreases, the voltage drop of the Schottky diode 655 decreases and consequently a reduction of potential of the N⁺ emitter 622 and the P base 620. This takes the P base 620 out of the low-resistance situation causing increase in the effective P base resistance in a negative feedback mechanism. This negative feedback mechanism leads to current saturation in the device.

The thyristor can be turned-off by reducing the gate electrode voltage from positive to negative to activate the lateral PMOS 646 from the P base 620 to the P⁺ cathode 626. The negative feedback mechanism described earlier reduces the risk of current crowding. The equivalent circuit of the FIG. 19 embodiment of the invention is shown in FIG. 19A.

A P⁻ diffusion 650 is preferably added in some regions of the multi-cell structure under the gate 638 overlying the channel between the P base 620 and P⁺ cathode 626, thereby adding a MOS gate controlled resistance path.

Figure 20:
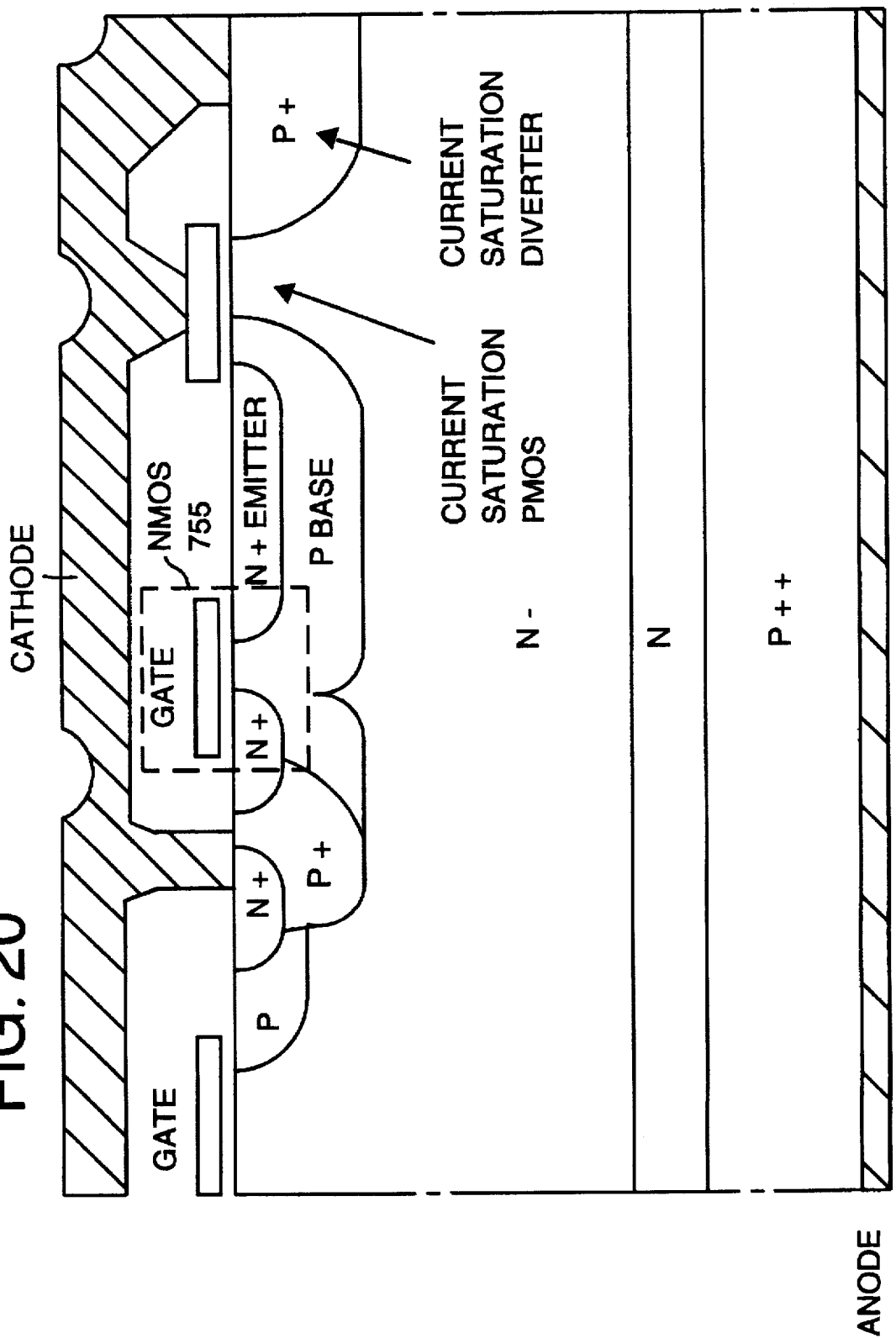
FIG. 20 shows a structure in which current saturation is obtained by activation of a PMOS and in which the $N^+$ emitter has a NMOS in series.

FIG. 20 shows an alternative emitter-switched embodiment using a NMOS and/or punch through NPN transistor in series with the N⁺ emitter. In the structure of FIG. 20, the N-channel lateral MOSFET 755 provides the resistive potential drop for the N⁺ emitter. The device embodiment of FIG. 20 can advantageously be turned-off simply by reducing the gate voltage to zero.

Although the present invention has been described in relation to particular embodiments thereof, many other variations and modifications (such as using trench gates instead of surface planar gates and different gate and channel region layout) will become apparent to those skilled in the art. It is preferred, therefore, that the present invention be limited not by the specific disclosure herein, but only by the appended claims.

What is claimed is:

1. A MOS-controlled thyristor, comprising:
   a wafer of semiconductor material having first and second spaced, parallel planar surfaces, at least a portion of the thickness of the wafer which extends from said first semiconductor surface comprising a relatively lightly doped layer of a first conductivity type for receiving junctions, at least a portion of the thickness of said wafer which extends from said second semiconductor surface comprising a relatively highly doped layer of a second conductivity type;

a first region of said second conductivity type comprising a base region formed in said relatively lightly doped layer of said first conductivity type and extending from said first semiconductor surface to a first depth beneath said first semiconductor surface;

an emitter region of said first conductivity type formed in said base and extending from said first semiconductor surface to a second depth beneath said semiconductor surface which is shallower than said first depth to create an emitter/base junction, said emitter region being radially inwardly spaced along said first semiconductor surface along edges of said base, such that said edges of said base extend to said first semiconductor surface, thereby defining a first channel region along a first of said edges;

a second region of said second conductivity type comprising a cathode region formed in said relatively lightly doped layer of said first conductivity type and extending from said first semiconductor surface, said cathode region being laterally spaced from said first edge of said base to form a second channel region in said relatively lightly doped layer of said first conductivity type;

a resistive structure disposed in series with said emitter region, said resistive structure comprising at least one structure selected from the group consisting of a MOSFET, a punch-through device, a diffused resistance, an $N^+$ contact resistance, a polysilicon resistive structure, a PN junction diode and a Shottky diode;

gate insulation layer means on said first semiconductor surface disposed at least on said first and second channel regions;

gate means disposed over said gate insulation layer means and overlying said first and second channel regions;

first electrode means connected to said layer of second conductivity type disposed on said second semiconductor surface;

second electrode means connected to said cathode region of second conductivity type, and gate electrode means connected to said gate means.

2. The MOS-controlled thyristor of claim 1, wherein said resistive structure comprises a MOSFET.

3. The MOS-controlled thyristor of claim 2, wherein said MOSFET comprises a PMOS transistor.

4. The MOS-controlled thyristor of claim 2, wherein said MOSFET comprises an NMOS transistor.

5. The MOS-controlled thyristor of claim 1, wherein said resistive structure comprises a MOSFET and a punch-through device disposed in series with said emitter region.

6. The MOS-controlled thyristor of claim 5, wherein said MOSFET comprises a PMOS transistor and said punch-through device comprises a punch-through PNP transistor disposed in series with said emitter region.

7. The MOS-controlled thyristor of claim 5, wherein said MOSFET comprises an NMOS transistor and said punch-through device comprises a punch-through NPN transistor disposed in series with said emitter region.

8. The MOS-controlled thyristor of claim 1, wherein said resistive structure comprises a diffused resistance disposed in series with said emitter region.

9. The MOS-controlled thyristor of claim 1, wherein said resistive structure comprises a contact resistance disposed in series with said emitter region.

10. The MOS-controlled thyristor of claim 1, wherein said resistive structure comprises a diffused resistance and a contact resistance disposed in series with said emitter region.

11. The MOS-controlled thyristor of claim 1, wherein said resistive structure comprises a punch-through device disposed in series with said emitter region.

12. The MOS-controlled thyristor of claim 11, wherein said punch-through device comprises a punch-through PNP structure.

13. The MOS-controlled thyristor of claim 11, wherein said punch-through device comprises a punch-through NPN structure.

14. The MOS-controlled thyristor of claim 1, wherein said resistive device comprises a polysilicon resistive structure in series with said emitter.

15. The MOS-controlled thyristor of claim 1, further comprising a relatively lightly doped diffusion of said second conductivity type disposed under said gate electrode means between said base region and said cathode region.

16. The MOS-controlled thyristor of claim 1, wherein said thyristor is provided in a cellular topology.

17. The MOS-controlled thyristor of claim 1, further comprising a layer of said first conductivity type disposed between said layer of said second conductivity type and said relatively lightly doped layer of said first conductivity type.

18. The MOS-controlled thyristor of claim 1, wherein said emitter is relatively highly doped.

19. The MOS-controlled thyristor of claim 1, wherein said resistive structure comprises a PN junction diode.

20. The MOS-controlled thyristor of claim 1, wherein said resistive structure comprises a Schottky diode.

21. The MOS-controlled thyristor of claim 14, further comprising a diverter region of said second conductivity type and a second electrode contacting said diverter region and spaced from base region, whereby said base region punches through to said diverter region when said base region reaches a predetermined potential, causing diversion of hole current from base region to diverter region.

22. The MOS-controlled thyristor of claim 14, further comprising a diverter region of said second conductivity type, a second electrode contacting said diverter region and spaced from said base region, and a second gate contacting said second electrode and overlying said relatively lightly doped layer of said first conductivity type extending between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

23. The MOS-controlled thyristor of claim 21, further comprising a relatively lightly doped diffusion of said second conductivity type disposed under said gate electrode means between said base region and said cathode region.

24. The MOS-controlled thyristor of claim 22, further comprising a relatively lightly doped diffusion of said second conductivity type disposed under said gate electrode means between said base region and said cathode region.

25. The MOS-controlled thyristor of claim 20, further comprising a diverter region of said second conductivity type contacted by second electrode spaced from said base region, such that said base region punches through to said diverter region when said base region reaches a predetermined potential, causing diversion of hole current from said base region to said diverter region.

26. The MOS-controlled thyristor of claim 20, further comprising a diverter region of said second conductivity type, a second electrode contacting said diverter region and spaced from base region, and a second gate contacting said second electrode and overlying said relatively lightly doped layer of first conductivity type between the said diverter region and said base region to form a MOSFET from said base region to said diverter region, said MOSFET being activated when the potential of said base region increases beyond a threshold voltage of said MOSFET, thereby causing diversion of hole current from said base region to said diverter region.

27. The MOS-controlled thyristor of claim 25, further comprising a relatively lightly doped diffusion of second conductivity type disposed under said gate electrode means between said base region and said cathode region.

28. The MOS-controlled thyristor of claim 26, further comprising a relatively lightly doped diffusion of said second conductivity type disposed under said gate electrode means between said base region and said cathode region.

29. The MOS-controlled thyristor of claim 2, further comprising a diverter region of said second conductivity type and a second electrode contacting said diverter region and spaced from said base region, whereby said base region punches through to said diverter region when said base region reaches a predetermined potential, causing diversion of hole current from said base region to said diverter region.

30. The MOS-controlled thyristor of claim 2, further comprising a diverter region of said second conductivity type, a second electrode contacting said diverter region and spaced from said base region, and a second gate contacting said second electrode and overlying said relatively lightly doped layer of said first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

31. The MOS-controlled thyristor of claim 5, further comprising a diverter region of said second conductivity type and a second electrode contacting said diverter region and spaced from base region, whereby said base region punches through to said diverter region when said base region reaches a predetermined potential, causing diversion of hole current from base region to diverter region.

32. The MOS-controlled thyristor of claim 5, further comprising a diverter region of said second conductivity type, a second electrode contacting said diverter region and spaced from base region, and a second gate contacting said second electrode and overlying said relatively lightly doped layer of said first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

33. The MOS-controlled thyristor of claim 8, further comprising a diverter region of said second conductivity type and a second electrode contacting said diverter region and spaced from base region, whereby said base region punches through to said diverter region when said base region reaches a predetermined potential, causing diversion of hole current from said base region to said diverter region.

34. The MOS-controlled thyristor of claim 8, further comprising a diverter region of said second conductivity type, a second electrode contacting said diverter region and spaced from base region, and a second gate contacting said second electrode and overlying said relatively lightly doped layer of first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

35. The MOS-controlled thyristor of claim 9, further comprising a diverter region of said second conductivity type and a second electrode contacting said diverter region and spaced from base region, whereby said base region punches through to said diverter region when said base region reaches a predetermined potential, causing diversion of hole current from said base region to said diverter region.

36. The MOS-controlled thyristor of claim 9, further comprising a diverter region of said second conductivity type, a second electrode contacting said diverter region and spaced from said base region, and a second gate contacting said second electrode and overlying said relatively lightly doped layer of said first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

37. The MOS-controlled thyristor of claim 10, further comprising a diverter region of said second conductivity type and a second electrode contacting said diverter region and spaced from base region, whereby said base region punches through to said diverter region when said base region reaches a predetermined potential, causing diversion of hole current from said base region to said diverter region.

38. The MOS-controlled thyristor of claim 10, further comprising a diverter region of said second conductivity type, a second electrode contacting said diverter region and spaced from said base region, and a second gate contacting said second electrode and overlying said relatively lightly doped layer of said first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

39. The MOS-controlled thyristor of claim 11, further comprising a diverter region of said second conductivity type and a second electrode contacting said diverter region and spaced from said base region, whereby said base region punches through to said diverter region when said base region reaches a predetermined potential, causing diversion of hole current from said base region to said diverter region.

40. The MOS-controlled thyristor of claim 11, further comprising a diverter region of said second conductivity type, a second electrode contacting said diverter region and spaced from said base region, and a second gate contacting said second electrode and overlying said relatively lightly doped layer of said first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

41. The MOS-controlled thyristor of claim 19, further comprising a diverter region of said second conductivity type and a second electrode contacting said diverter region and spaced from base region, whereby said base region punches through to said diverter region when said base region reaches a predetermined potential, causing diversion of hole current from said base region to said diverter region.

42. The MOS-controlled thyristor of claim 19, further comprising a diverter region of said second conductivity type, a second electrode contacting said diverter region and spaced from said base region, and a second gate contacting said second electrode and overlying said relatively lightly doped layer of first conductivity type between said diverter region and said base region to form a MOSFET from said base region to said diverter region, said MOSFET being activated when the potential of said base region increases beyond a threshold voltage of said MOSFET, thereby causing diversion of hole current from said base region to said diverter region.

43. A MOS-controlled thyristor, comprising:

a wafer of semiconductor material having first and second spaced, parallel planar surfaces, at least a portion of the thickness of the wafer which extends from said first semiconductor surface comprising a relatively lightly doped layer of a first conductivity type for receiving junctions, at least a portion of the thickness of said wafer which extends from said second semiconductor surface comprising a relatively highly doped layer of a second conductivity type;

a first region of said second conductivity type comprising a base region formed in said relatively lightly doped layer of said first conductivity type and extending from said first semiconductor surface to a first depth beneath said first semiconductor surface;

an emitter region of said first conductivity type formed in said base and extending from said first semiconductor surface to a second depth beneath said semiconductor surface which is shallower than said first depth to create an emitter/base junction, said emitter region being radially inwardly spaced along said first semiconductor surface along edges of said base, such that said edges of said base extend to said first semiconductor surface, thereby defining a first channel region along a first of said edges;

a second region of said second conductivity type comprising a cathode region formed in said relatively lightly doped layer of said first conductivity type and extending from said first semiconductor surface, said cathode region being laterally spaced from said first edge of said base region to form a second channel region in said relatively lightly doped layer of said first conductivity type;

resistive means disposed in series with said emitter region for creating a sufficient voltage drop between said emitter region and said base region when said thyristor is conducting current, such that the potential of said base region increases beyond a predetermined value where punch-through or hole diversion occurs between said base region and said cathode region;

gate insulation layer means on said first semiconductor surface disposed at least on said first and second channel regions;

gate means disposed over said gate insulation layer means and overlying said first and second channel regions;

first electrode means connected to said layer of second conductivity type disposed on said second semiconductor surface;

second electrode means connected to said cathode region of second conductivity type, and gate electrode means connected to said gate means.

* * * * *